(12) United States Patent  (10) Patent No.:  US 6,265,793 B1
Korenaga  (45) Date of Patent:  Jul. 24, 2001

(54) LINEAR MOTOR COIL FOR EXPOSURE APPARATUS

(75) Inventor: Nobushige Korenaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/438,524

(22) Filed: Nov. 12, 1999

(30) Foreign Application Priority Data

Nov. 12, 1998 (JP) .................................................. 10-338508
Oct. 20, 1999 (JP) .................................................. 11-298171

(51) Int. Cl.[7] .................................................. H02K 41/00
(52) U.S. Cl. .................................................. 310/12
(58) Field of Search .................................. 310/12, 42, 45; 335/282

(56) References Cited

U.S. PATENT DOCUMENTS

Re. 34,674 * 7/1994 Beakley et al. .......................... 310/12
2,998,583 * 8/1961 Worcester .......................... 336/223 X
5,623,853 * 4/1997 Novak et al. .......................... 74/490.09
5,674,340 * 10/1997 Swiatkowski et al. .............. 156/184
5,841,250 11/1998 Korenaga et al. .................... 318/135

FOREIGN PATENT DOCUMENTS 4-9028 2/1992 (JP) .

* cited by examiner

Primary Examiner—Nestor Ramirez
Assistant Examiner—Judson H. Jones
(74) Attorney, Agent, or Firm—Fitzpatrick, Cella, Harper & Scinto

(57) ABSTRACT

A conductive foil is wound into a roll to provide a roll coil, and the roll coil is cut along wire paths, whereby a flat coil with a level difference is produced. Similarly, a flat coil without a level difference is sliced from the roll coil. The flat coil with a level difference and the flat coil without a level difference are then disposed with partial overlapping, while magnet side faces of the coils become coplanar with each other, to provide a unit coil. A plurality of unit coils can be placed juxtaposed with each other, to provide a stator for a linear motor. The number of working operations is reduced significantly, and the reliability of the coil itself is improved.

33 Claims, 22 Drawing Sheets

US 6,265,793 B1

LINEAR MOTOR COIL FOR EXPOSURE APPARATUS

FIELD OF THE INVENTION AND RELATED ART

This invention relates to a coil with a level difference, suitably usable in a linear motor, for example, for moving an X-Y stage of a semiconductor exposure apparatus or a precision positioning stage of a precision machining apparatus, for example. In another aspect, the invention is concerned with a method of producing a coil with a level difference, such as described above. In further aspects, the invention is concerned with a linear motor, a stage system, an exposure apparatus or a device manufacturing method which uses such a coil with a level difference.

A linear motor to be used in driving an X-Y stage of a semiconductor exposure apparatus or a precision positioning stage of a precision machining apparatus, for example, has a structure such as shown in FIG. 18A or 18B. As shown in the drawings, a workpiece 112 is placed on a stage 110 which is slidably supported on a guide 111, fixedly mounted on a base (not shown), for sliding motion along a driving direction. The stage can be moved in the driving direction by means of a linear motor system 101 having components disposed on the opposite sides of the stage 110. More specifically, the linear motor 101 has stators 102 each having six coils 105 fixedly mounted on a stator frame 104 to provide a stator unit. The stator frames 104 are disposed along the guide 111 and on the opposite sides thereof, and they are fixed to the unshown base through fixing members (not shown). Moving elements 103 of the linear motor 101 each comprises a four-pole magnet 106 which is magnetized vertically and combined integrally with a yoke 108a or 108b. There are upper and lower moving elements 103 disposed above and below the stator 102 unit, and the pairs of the moving elements 103 are fixedly mounted on the opposite sides of the stage 110 without contact to the stator 102. The six coils 105 are arrayed along the driving direction of the stage 110, with a pitch 1.5 times the magnetic pole pitch thereof. The magnetic pole pitch corresponds to a half period of a basic wave of the magnetic density. Therefore, the pitch of the six coils 105 corresponds to 0.75 period of the basic wave of the magnetic density, and, in terms of electric angle, it corresponds to 270 deg. or −90 deg.

In operation of the linear motor of the structure described above, while a relative positional relation between the magnet 106 and the coils 105 is detected by means of a sensor (not shown), those coils 105 at positions spaced by 270 or −90 degrees are sequentially selected and an electric current is applied sequentially to these coils in an appropriate direction, by which a driving force in the same direction is produced. In the sense that coils having orthogonal electric angles are sequentially interchanged, it is a dual-phase motor.

FIGS. 19A and 19B show another type of linear motor In this linear motor 201, upper and lower yokes 204a and 204b each comprising a laminated steel plate are disposed at a stator 202 side, and only magnets 206 are made movable for reduction of the weight of the whole moving parts. More specifically, there are four-pole magnets 206 which are fixedly mounted, through supporting members 207, on opposite sides of a stage 110 being slidably movable along a guide 111, by which movable elements 203 are provided. Upper and lower yokes 204a and 204b have a plurality of arrayed flat coils 205, by which stators 202 are provided. The flat coils 205 and the yokes 204a and 204b are fixedly mounted along the opposite sides of the guide 111, so as to sandwich the movable element 203 between them with respect to a vertical direction. The function and operation of this linear motor are the same as those of the structure shown in FIGS. 18A and 18B.

In the linear motors shown in FIGS. 18A, 18B, 19A and 19B, only a half area of the magnet faces to the coil and, therefore, it is difficult to accomplish an efficient ampere-turn per magnet area. As a solution for the problem of ampere-turn, structures such as shown in FIGS. 20A, 20B, 22A and 22B have been proposed, wherein coils are disposed with partial overlapping.

In the coil structure of a linear motor shown in FIGS. 20A and 20B, which is also illustrated in an enlarged view of FIG. 21, a phase-A coil 305a and a phase-B coil 305b are disposed with a shift of 90 deg. with reference to a length twice the magnetic pitch, such that they partially overlap with each other. If a phase-A coil and a phase-B coil are simply placed with overlapping, the air gap of the magnet increases by an amount corresponding to the coil thickness. In consideration of it, the magnet faces m of straight portions of the phase-B coil 305b to be opposed to the magnet are bent down so that they become coplanar with the phase-A coil 305a.

In order to produce a coil with a level difference (step) such as the phase-B coil 305b described above, a wire c may be wound around a core (not shown) by a predetermined number of turns, to form a simple flat coil similar to the phase-A coil 305a. Here, the wire c may not be bonded, but temporarily fixed, so as to keep the shape as a whole. Subsequently, the flat coil may be bent mechanically to make a level difference (step). Then, the wire c may be bonded, whereby a coil with a level difference may be accomplished. In regard to a coil of a large thickness such as the coil 105 shown in FIG. 18A or ISE, a phase-B coil with a level difference cannot be produced. On that occasion, a phase-A coil 305a of a thickness about a half of that of the coil shown in FIG. 18A or 18B and a phases coil 305b with a level difference may be prepared, and they may be disposed with a shift of 90 deg., as shown in FIG. 21, to provide a unit coil 305u.

In the linear motor structure 301 shown in FIG. 20A or 20B, only the magnet is a movable element. There are unit coils 305u juxtaposed to the laminated yoke 304 (304a and 304b), by which a stator unit 302 is provided. The stator units 302 are fixedly supported by supporting means (not shown), from above and below the magnet 306. With the division of the stator into two, upper and lower stator elements as described above, an efficient total coil thickness may be attained.

On the other hand, in the linear motor structure 401 shown in FIGS. 22A and 22B, coplanar faces of unit coils 305u such as described above are adhered to each other to provide a double-coil unit 305w. Such double-coil units 305w are juxtaposed with each other along the driving direction, and they are fixed together by fixing means (not shown) corresponding to the stator frame of FIG. 18A, by which a stator 402 is provided. Movable elements 403 have a similar structure as that shown in FIG. 18A or 18B. Here, upper and lower yokes 408a and 408b having four-pole magnets 406 are coupled to each other through side plates 409a and 409b so that their magnets are opposed to each other, by which a box-like movable element 403 is provided. Also, in this example, a coil with a level difference having a large thickness cannot be produced at once. Thus, small-thickness unit coils 305u are adhered to each other to provide a double-coil unit 305w, by which an efficient total coil thickness is accomplished.

As regards the production of a coil with a level difference, to be used in a linear motor, for example, the coil-bending method described above needs the procedure for winding a wire to form a coil, bending the coil not. bonded, and then bonding the wire. Thus, the coil production process is very complicated.

Further, the coil bending work applies a stress to the wire, causing decreased insulation reliability or a possibility of breakage of the wire.

Moreover, it is difficult to bend a thick coil. If, therefore, a thick coil is desired, it is necessary to prepare thin coils and to couple them together after bending them separately. The number of coils becomes large, and also the number of work steps becomes large.

SUMMARY OF THE INVENTION

It is accordingly an object of the present invention to provide a flat coil with a level difference suitably usable in a linear motor, for example, by which the number of work steps for production can be reduced, and by which the reliability of the coil itself can be increased. With the present invention, a large-thickness coil can be produced, and the number of components and the number of work steps for production of the coil can be reduced.

It is another object of the present invention to provide a method of producing such a coil with a level difference as described above, or to provide a linear motor having a flat coil with a level difference produced in accordance with the method described above.

In accordance with an aspect of the present invention, there is provided a method of producing a coil with a level difference, comprising the steps of: winding a conductive foil into a roll to provide a roll coil; and slicing, by wire cutting, the roll coil so that a coil having a level difference formed thereon is produced.

The roll coil may preferably be sliced so that, in a coil produced by the slicing, a straight portion and a bent portion, for defining the level difference, have the same thickness.

The roll coil may preferably be sliced so that, in a coil produced by the slicing, the magnitude of the level difference formed is larger than the coil thickness.

The method may further comprise etching a section of a coil produced by the slicing.

The method may further comprise providing an insulating material at a section of a coil produced by the slicing.

The method may further comprise providing an insulating material at a portion of a coil, of coils produced by the slicing, which portion is to be opposed to another coil.

The Insulating material may be provided through one of applying an insulating material, adhesion of an insulating tape and insertion of an insulating plate.

In accordance with another aspect of the present invention, there is provided a coil with a level difference, characterized in that the coil has a straight portion and a portion with the level difference, and that a conductive material for the coil has a shape defined by winding a conductive foil.

The coil may preferably be produced by slicing a roll coil provided by winding the conductive foil.

The section of the coil produced by the slicing may be processed by etching.

The coil may further comprise an insulating material provided at the section of the coil produced by the slicing.

The insulating material may be provided through one of applying an insulating material, adhesion of an insulating tape and insertion of an insulating plate An insulating material may be provided to prevent an electric short circuit between layers of the conductive foil.

In accordance with a further aspect of the present invention, there is provided a linear motor comprising a coil with a level difference as described above.

The linear motor may further comprise a unit coil including at least two coils, each having a level difference, which may be disposed with partial overlapping.

The linear motor may further comprise an insulating material provided at a portion where coils of the unit coil are opposed to each other.

The coil unit may be fixed to a yoke, and an insulating material may be provided between the coil and the yoke.

In accordance with a yet further aspect of the present invention, there is provided a linear motor, comprising: a coil unit including at least two coils each having a straight portion and a portion with a level difference, the coils being disposed with partial overlapping; a yoke for holding the coil unit; and an insulating material provided between the unit coil and the yoke In accordance with a still further aspect of the present invention, there is provided a linear motor, comprising: a coil unit including at least two coils each having a straight portion and a portion with a level difference, the coils being disposed with partial overlapping; aid an insulating material provided at a portion where coils of the unit coil are opposed to each other.

In the linear motors described above, a magnet may be provided at a movable element side thereof while the coil may be provided at a stator side thereof.

In accordance with a yet further aspect of the present invention, there is provided a stage system having a linear motor as described above.

In accordance with a yet further aspect of the present invention, there is provided an exposure apparatus having a stage system as described above and being used for at least one of a reticle stage and a wafer stage.

In accordance with a yet further aspect of the present invention, there is provided a device manufacturing method, comprising the steps of: preparing an exposure apparatus as described above; and transferring a pattern formed on a reticle onto a wafer by use of the exposure apparatus.

In one preferred form of the present invention, a flat coil with a level difference and a flat coil without a level difference are disposed with partial overlapping to provide a unit coil. A plurality of unit coils, each being such as described above, may be juxtaposed with each other to provide a stator for a linear motor. The flat coil with a level difference such as described above may be produced by winding a conductive foil into a roll to provide a roll coil, and then slicing, by wire cutting, for example, the roll coil so that a coil having a level difference formed thereon is produced. This does not require coil bending work. Therefore, the coil producing procedure can be simplified, and the number of required processes can be reduced. Further, application of a stress to a wire or breakage of the wire can be prevented, such that the reliability of the coil itself or the reliability of the linear motor can be improved.

A flat coil with a level difference, having a large thickness, can be produced. The number of components or the number of assembling works required for the production can be reduced.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

[Embodiment 1]

Figure 1A:
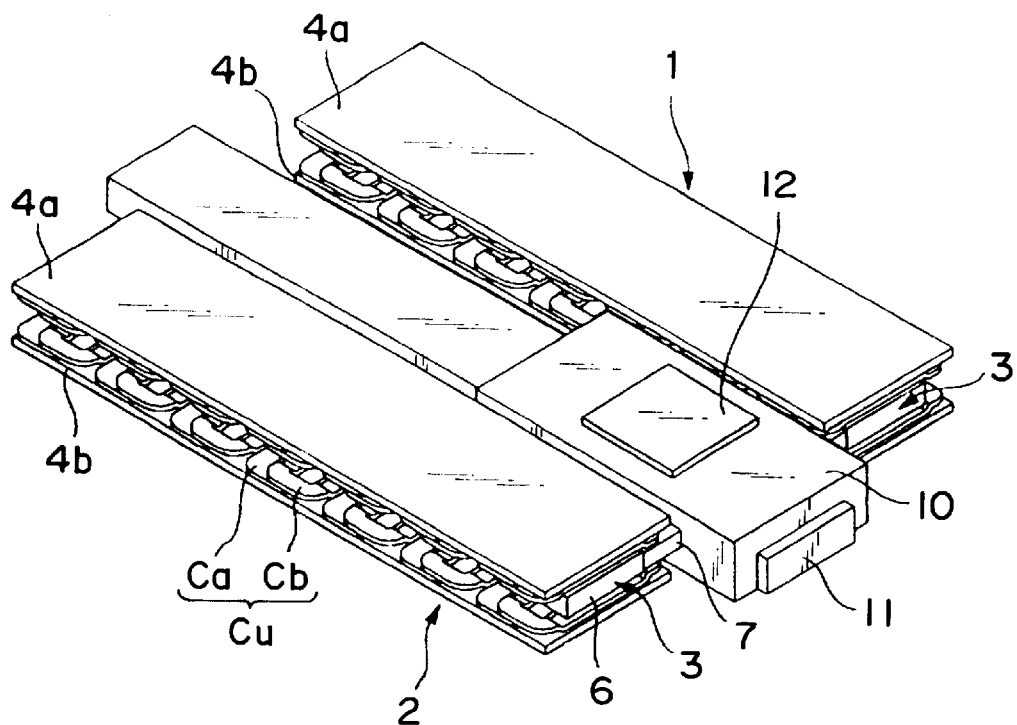
FIG. 1A is a perspective view of a linear motor having a flat coil with a level difference, according to an embodiment of the present invention.
Figure 1B:
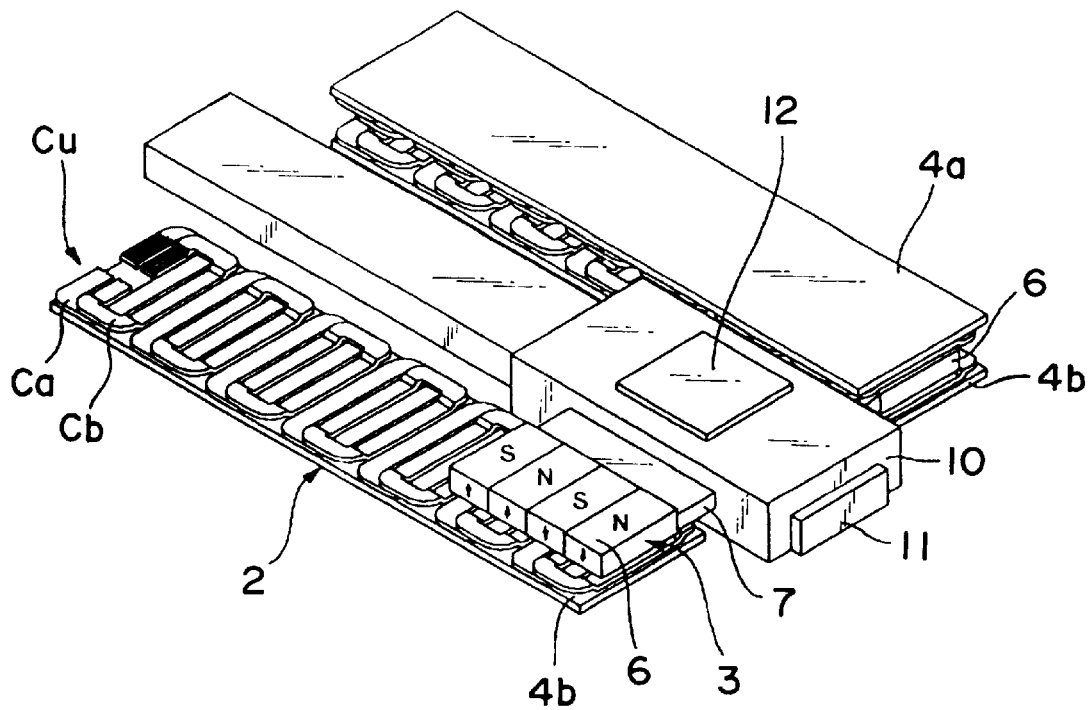
FIG. 1B is a perspective view wherein a portion of the linea motor is omitted in illustration.
Figure 2:
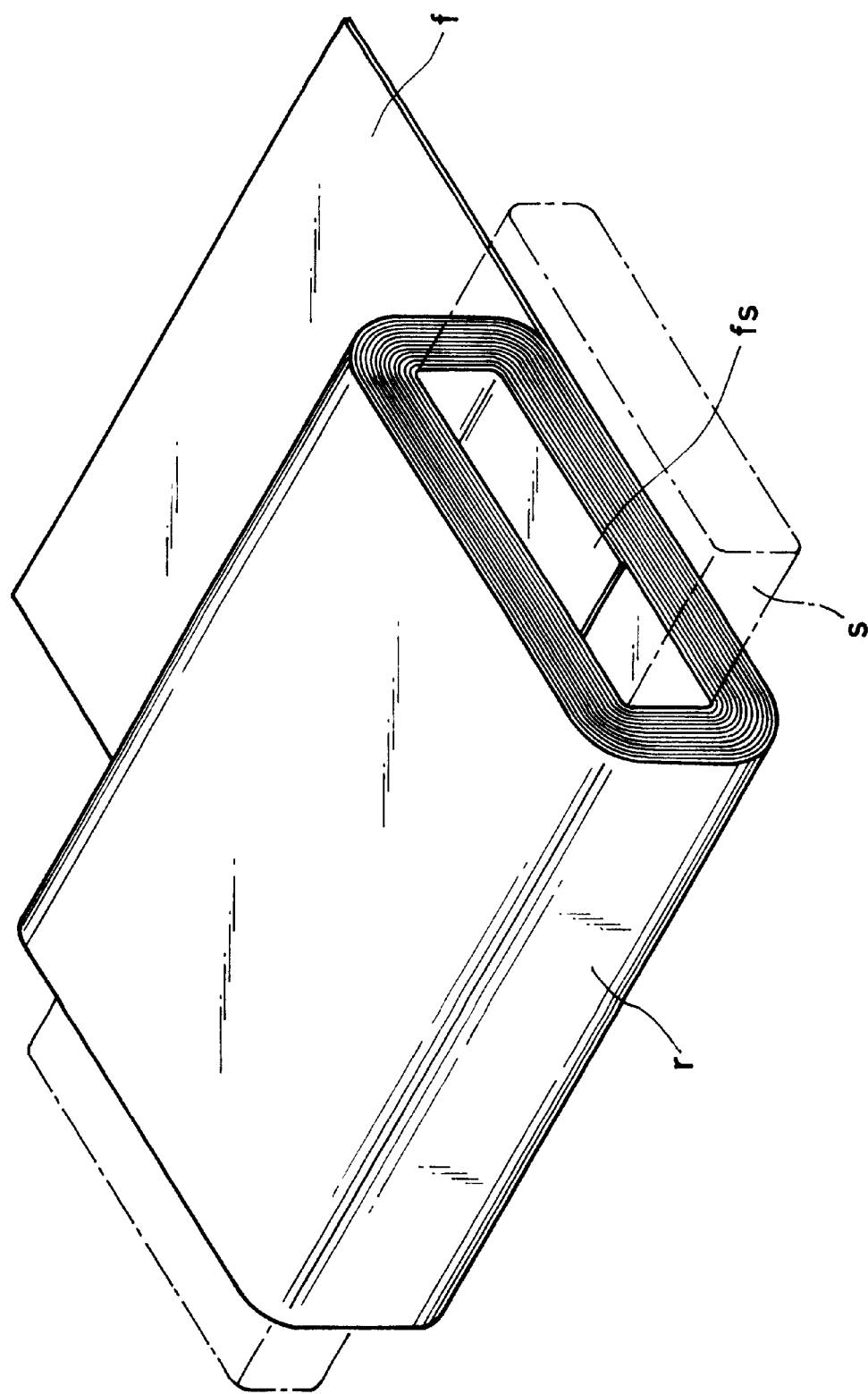
FIG. 2 is a perspective view for explaining a method of producing a flat coil with a level difference, and it schematically illustrates a process for forming a roll coil by use of a conductive foil.
Figure 3A:
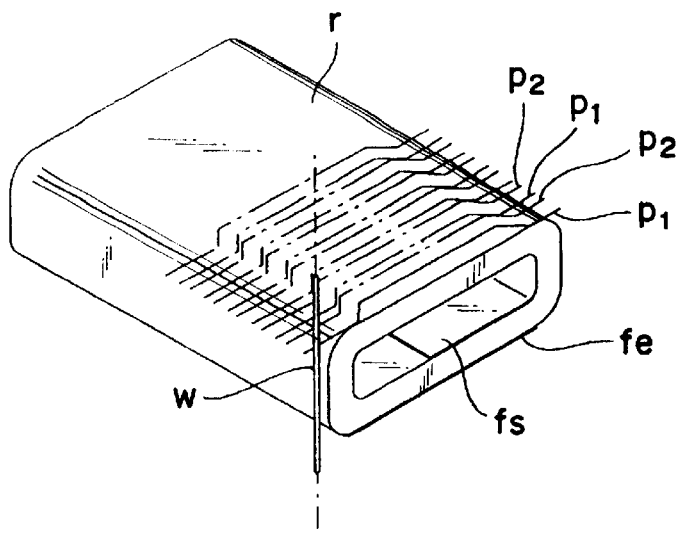
FIGS. 3A, 3B and 3C are perspective views, respectively, for explaining a method of producing a flat coil with a level difference, and they schematically illustrate a process for forming a phase-B flat coil with a level difference, from a roll coil.
Figure 3B:
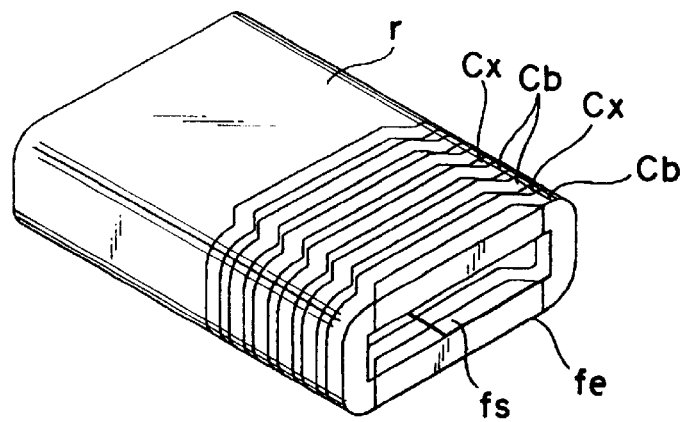
Figure 3C:
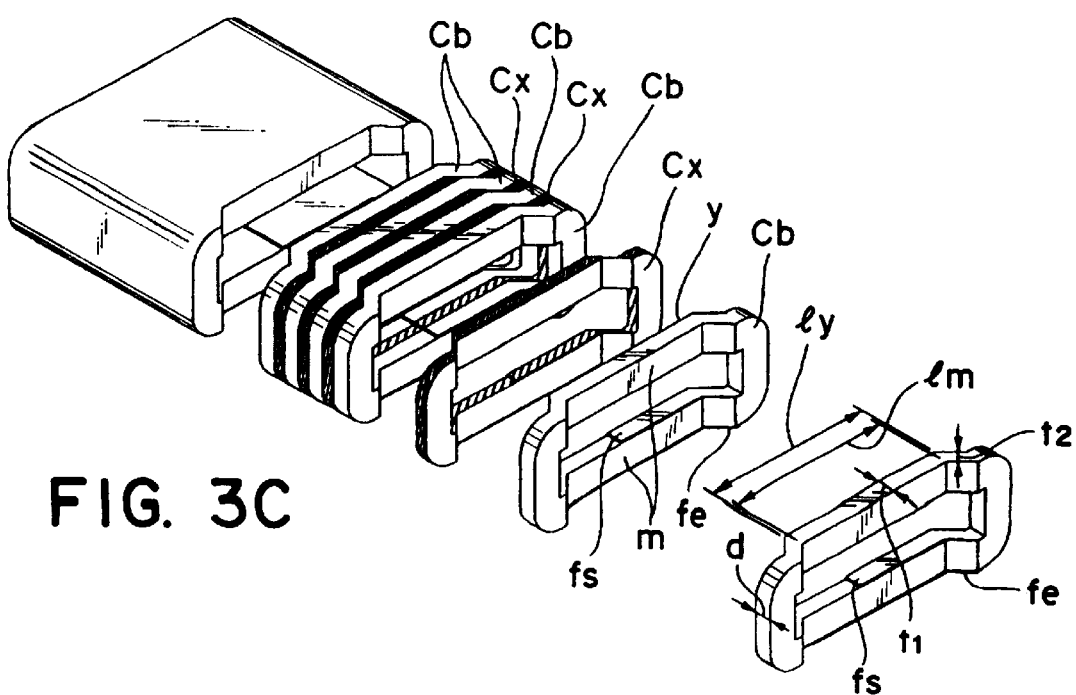
Figure 4A:
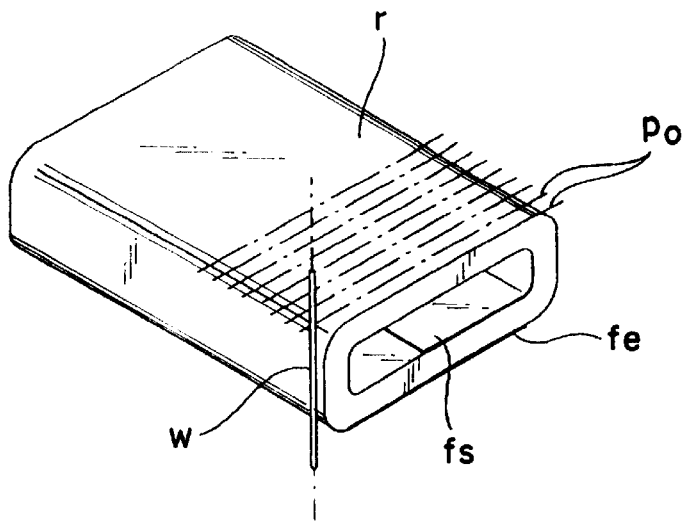
FIGS. 4A, 4B and 4C are perspective views. respectively, for explaining a method of producing a flat coil without a level difference, and they schematically illustrate a process for forming a phase-A flat coil without a level difference, from a roll coil.
Figure 4B:
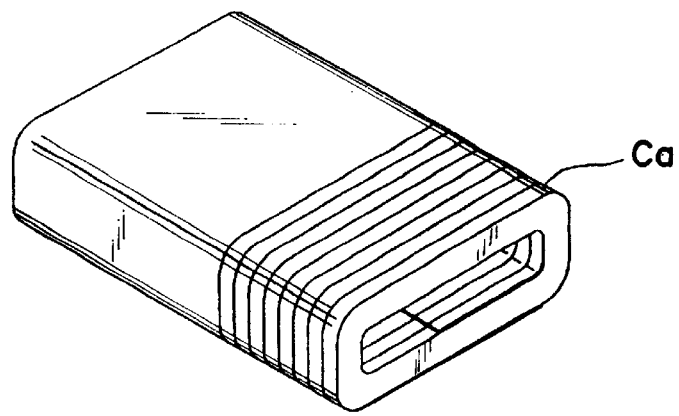
Figure 4C:
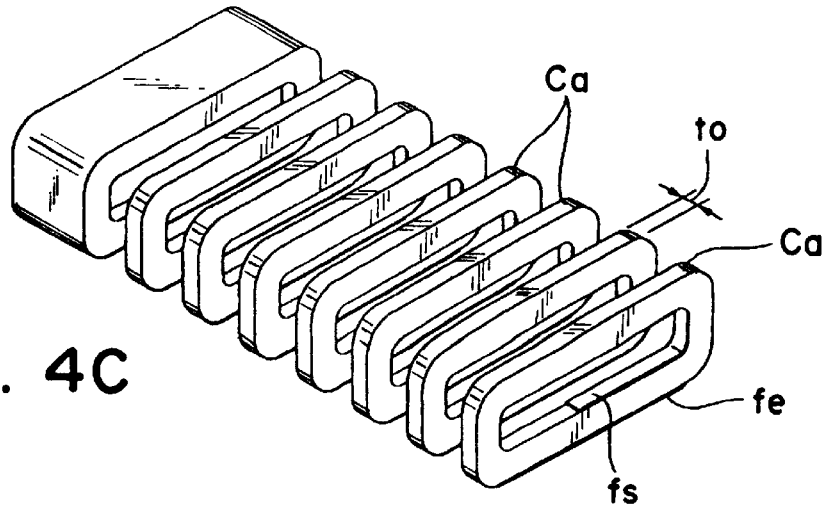
Figure 5:
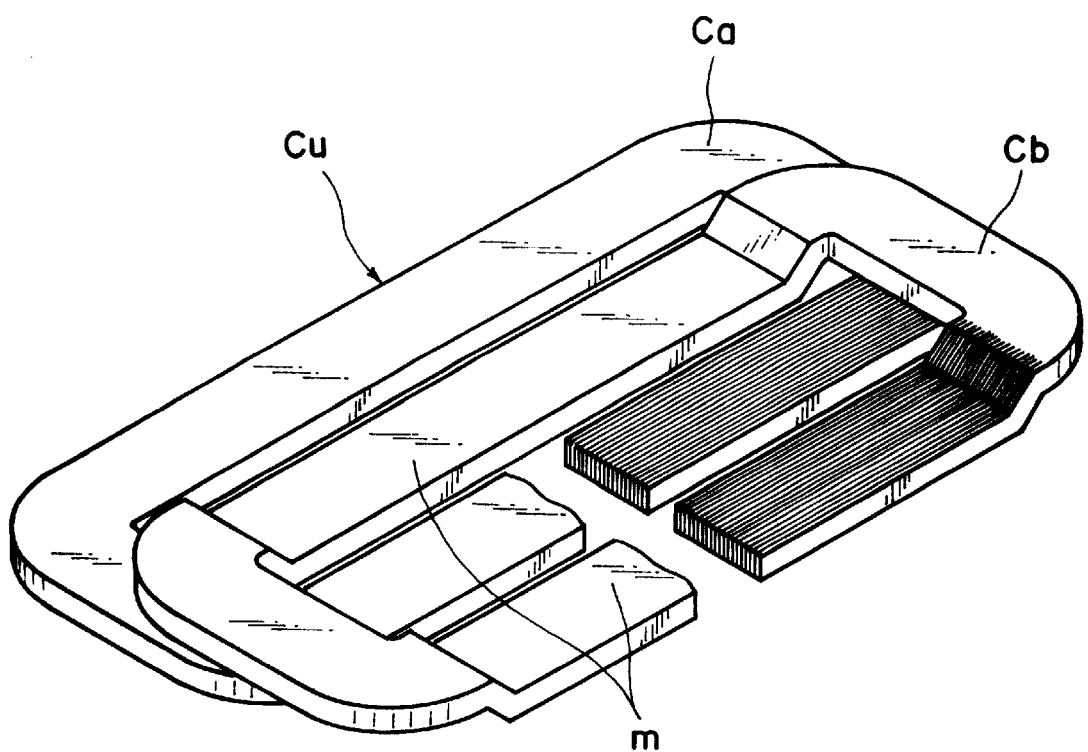
FIG. 5 is a perspective view of a coil unit, having a phase-A coil and a phase-B coil, manufactured in accordance with the present invention.

FIGS. 1A and 1B are perspective views of an example of a linear motor having a flat coil with a level difference, according to an embodiment of the present invention. FIGS. 2, 3A–3C, 4A–4C are schematic views, respectively, for explaining processes for forming a flat coil with a level difference and a flat coil without a level difference. More specifically, FIG. 2 is a perspective view schematically illustrating a process for forming a roll coil by use of a conductive foil. FIGS. 3A, 3B and 3C schematically illustrate a process for forming a phase-B flat coil with a level difference, from a roll coil. FIGS. 4A, 4B and 4C schematically illustrate a process for forming a phase-A flat coil without a level difference, from a roll coil. FIG. 5 is a perspective view of a coil unit, having a phase-A coil and a phase-B coil, manufactured in accordance with the present invention.

Initially, referring to FIGS. 2–4C, a process for producing a phase-A coil without a coil level difference and a phase-B coil having a level difference, will be described.

First, as shown in FIG. 2, a sheet-like conductive foil f having an insulating treatment and a thermo-setting adhesive agent application treatment applied to its opposite surfaces, is wound around a core s by a predetermined number of turns, by which a roll coil r is provided. The core s is then removed from the roll coil r. Subsequently, heat is applied to it, by which layers of conductive foil f are adhered with each other due to the thermo-setting adhesive agent and, as a result, the foil layers are bonded together integrally.

Then, for production of a phase-B flat coil having a level difference (step), as shown in FIG. 3A, the roll coil r is introduced into a wire-cutting machine (not shown) so that the wire w of the wire-cutting machine extends substantially parallel to a side of the roll coil r Then, the wire w is moved sequentially along a first wire path p1 and a second wire path p2 having been set as shown in FIG. 3A, so that the roll coil r is cut or sliced. Each of the wire paths p1 and p2 has a bent portion corresponding to a central portion of the roll coil r, and these paths are arranged to produce a flat coil Cb having a regular thickness, over the whole flat coil, as a shape shown in FIG. 3C. The interval between the first and second wire paths p1 and p2 is set to a value corresponding to the thickness t1 of a straight portion of the flat coil. Subsequently, as shown in FIG. 3B, the cutting operation for the roll coil r along the first and second wire paths p1 and p2 is repeated.

Through the cutting operation for the roll coil r described above, as shown in FIG. 3C, phase-B coils Cb having a constant coil thickness and coil members Cx (unnecessary elements) of a different thickness as depicted by hatching, are alternately sliced. Here, in a phase-B flat coil Cb, the bent portion thereof has a face to be opposed to a magnet. Hereinafter, this face will be referred to as "magnet side face m" while the face opposite to the magnet side face will be referred to as "yoke side face y". In a phase-B flat coil Cb produced as described above, if the thickness t1 of the straight portion and the thickness t2 of a bent or curved portion thereof are made equal to each other, the lengthly of the straight portion of the yoke side face y (hereinafter, simply "yoke side face length") becomes larger than the length lm of the straight portion of the magnet side face m (hereinafter, simply "magnet side face length"). Therefore, in order to slice such a phase-B coil Cb, two different wire paths p1 and p2 are necessary. As a result of it, a coil member Cx is produced as an unnecessary material and is unused. Further, in FIG. 3C, unless the size d of the level difference is made not smaller than the thickness t1 of the straight portion, the air gap of the magnetic circuit increases. Therefore, the level difference size d should preferably be designed to substantially satisfy d=(coil straight portion thickness t1+insulating layer thickness+tolerance).

After the slicing of the roll coil through wire cutting, the section of a coil may preferably be treated by etching. This effectively removes any flash between layers due to the slicing or short circuit between layers due to cut particles. Further, an insulating treatment may be made to the section having the short circuit removed, by applying an insulative resin to the section or by adhering an insulating tape thereto, for example. Thereafter, lead wires (not shown) may be bonded, by soldering, for example, to a winding start portion of the conductive foil, placed at an inner circumferential portion of the coil, and to a winding end portion of the foil placed at an outer circumferential portion of the coil, respectively. By this, a single coil is completed.

For example, in a phase-B flat coil Cb, after the slicing, an insulating treatment may be made to the sectional face of the phase-D flat coil Cb, and lead wires (not shown) may be bonded, by soldering, for example, to a winding start portion fs of the conductive foil f, placed at an inner circumferential portion of the phase-B flat coil Cb, and to a winding end portion fe of the foil f placed at an outer circumferential portion of the coil, respectively. By this, a single structure of phase-B flat coil is completed.

Figure 6:
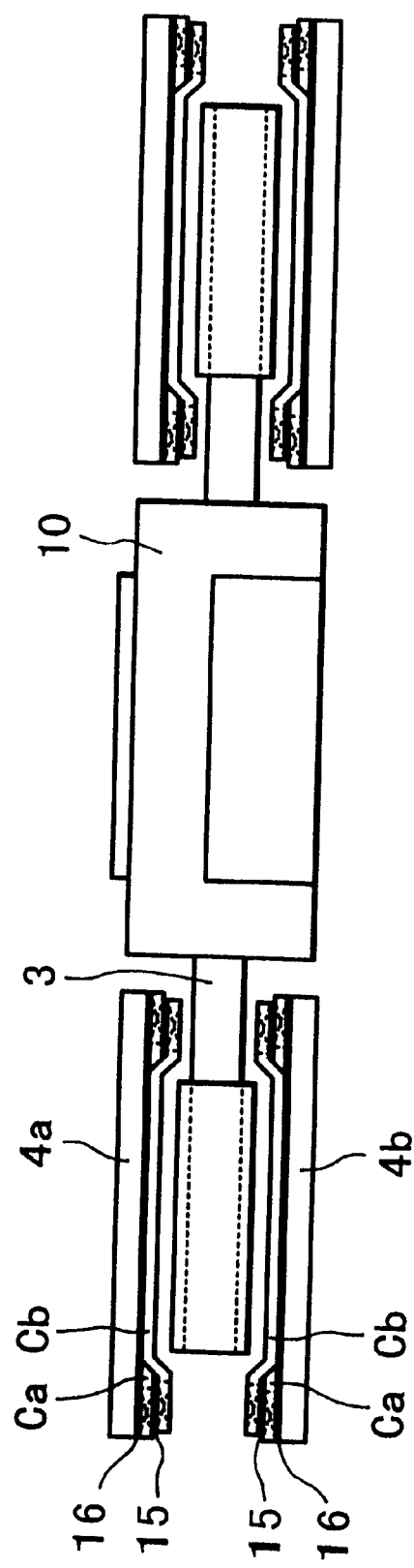
FIG. 6 is a side view of the linear motor of FIG. 1A, as seen in the movement direction thereof.

In a dual-phase linear motor as in this embodiment, the dual-phase coils (phase-A flat coil Ca and phase-i flat coil Cb) are disposed while their portions, other than their magnet side faces, overlap with each other. Thus, at the R portions on the opposite ends of the coil, two coils are opposed to each other. For this reason, the insulating treatment to those portions where a phase-A flat coil Ca and a phase-B flat coil Cb are opposed to each other, is particularly important to prevent a short circuit between the phases A and B. Thus, in addition to the application of an insulative resin coating or adhesion of an insulating tape to the section of the coil described above, as shown in FIG. 6, an insulating plate 15 of a resin material, for example, having a thickness of 0.2 mm or more, may preferably be inserted between the phases A and B, for complete insulation. Namely, the insulating plate 15 of resin, for example, to be inserted between the phases A and B may well be formed with a thickness and a material sufficient for electrically insulating the phases A and B from each other. In regard to the straight portion of the coil, if it is to be opposed to a yoke such as shown in FIG. 1A or 1B, in addition to the insulating coating, for example, similarly, an insulating plate 16 may preferably be provided between the yoke and the coil. As described, in the case of a coil with a level difference, there is a level difference between the straight portion of the coil and the R portion at an end thereof and, therefore, two types of insulating plates 15 and 16 may be provided separately.

On the other hand, for production of a phase-A flat coil, a roll coil r as shown In FIG. 2 is prepared in a similar manner as the production of a phase-B flat coil Cb. Then, as shown in FIG. 4A, the roll coil r is introduced into a wire-cutting machine (not shown) so that the wire w of the wire-cutting machine extends substantially parallel to a side of the roll coil r. Then, the wire w is moved along a straight wire path p0 shown in FIG. 4A, so that the roll coil r is cut or sliced. The interval between adjacent wire paths p0 is set to a value corresponding to the coil thickness to. By repeating the cutting operation along wire paths p0, phase-A flat coils Ca of a thickness t0 are produced, as shown in FIGS. 4B and 4C. Here, the thickness t0 of the phase-A flat coil Ca is made preferably substantially equal to the thickness t1 of the straight portion of the phase-B flat coil Cb. Subsequently, like the phase-B flat coil Cb, an insulating treatment is made to the section of the phase-A flat coil Ca, and, thereafter, lead wires (not shown) are bonded, by soldering, for example, to a winding start portion fs of the conductive foil f, placed at an inner circumferential portion of the phase-A flat coil Ca, and to a winding end portion fe of the foil f placed at an outer circumferential portion of the coil, respectively. By this, a single structure of phase-A flat coil is completed.

In this embodiment, a wire-cutting operation is used because it is geometrically difficult to cut a roll coil into a coil with a level difference, such as a phase-B flat coil, by use of a flat cutting plate such as a metal saw, for example. In the case of a flat coil such as a phase-A flat coil, first, a conductive foil may be cut and then wound. However, for a shape having a level difference such as that of the phase-B coil, such a procedure is difficult to accomplish.

A phase-A flat coil Ca and a phase-B flat coil Cb prepared in the manner described above are then disposed as shown in FIG. 5, with a mutual shift of 90 deg. with reference to a size twice the magnetic pitch, so that the magnet side face m of the straight portion (bent portion) of the phase-B flat coil Cb is placed coplanar with the face at the straight portion of the phase-A flat coil Ca. By this, a single unit coil Cu is provided.

Figure 20A:
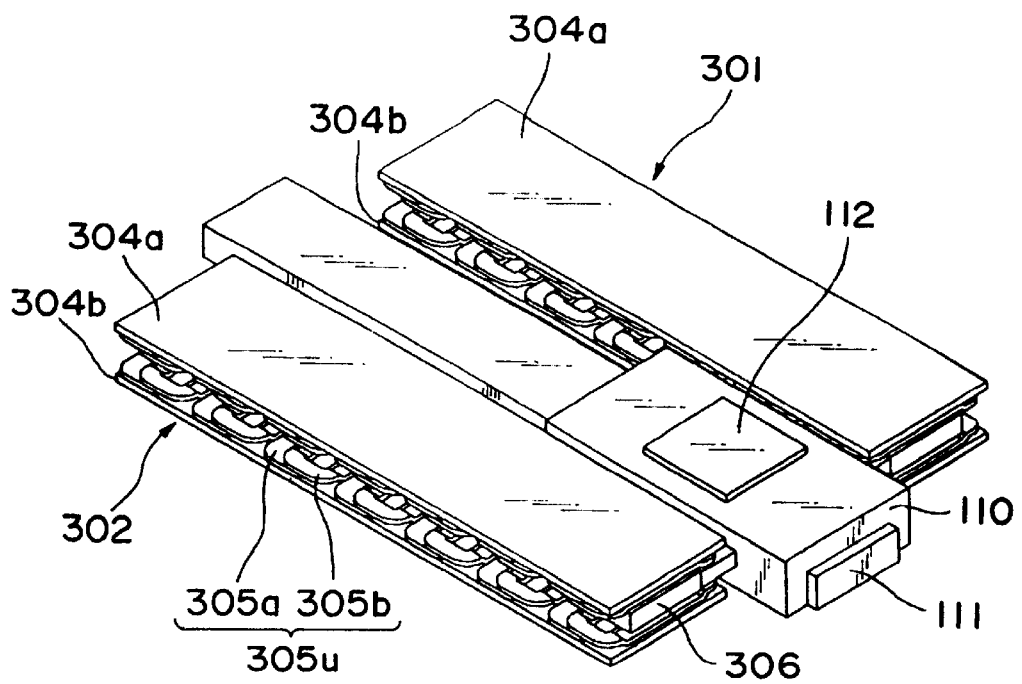
FIG. 20A is a perspective view of another example of a linear motor of a known type.
Figure 20B:
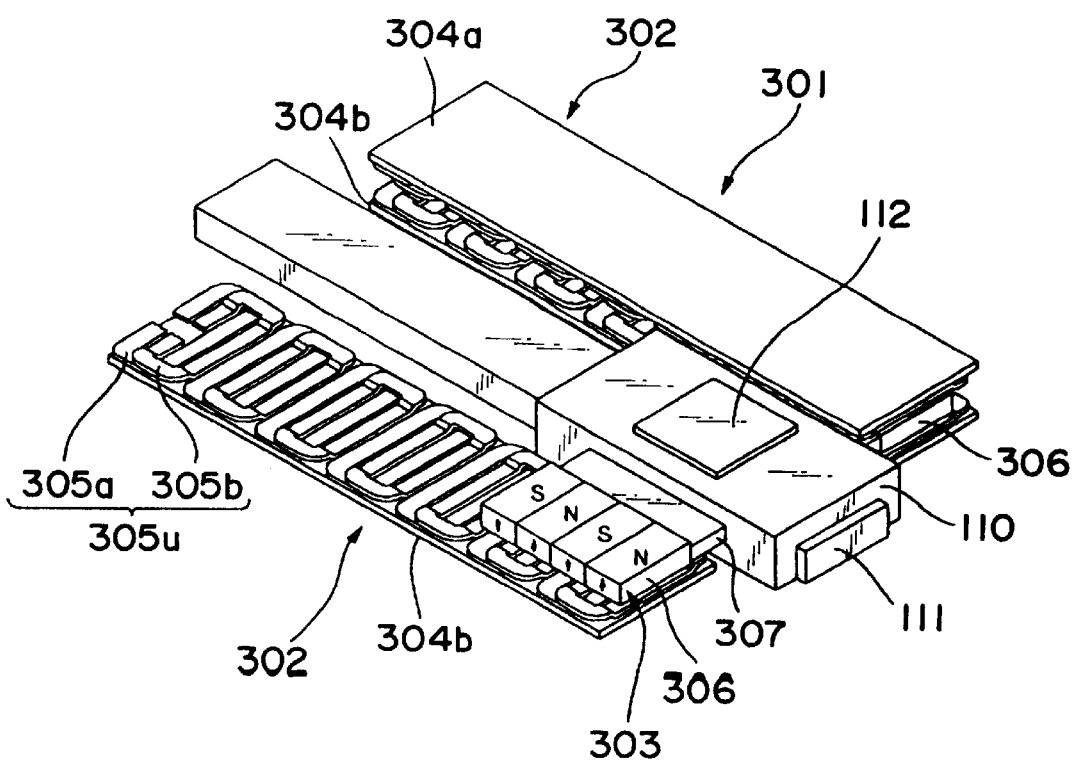
FIG. 20B is a perspective view wherein a portion of the linear motor is omitted in illustration.
Figure 21:
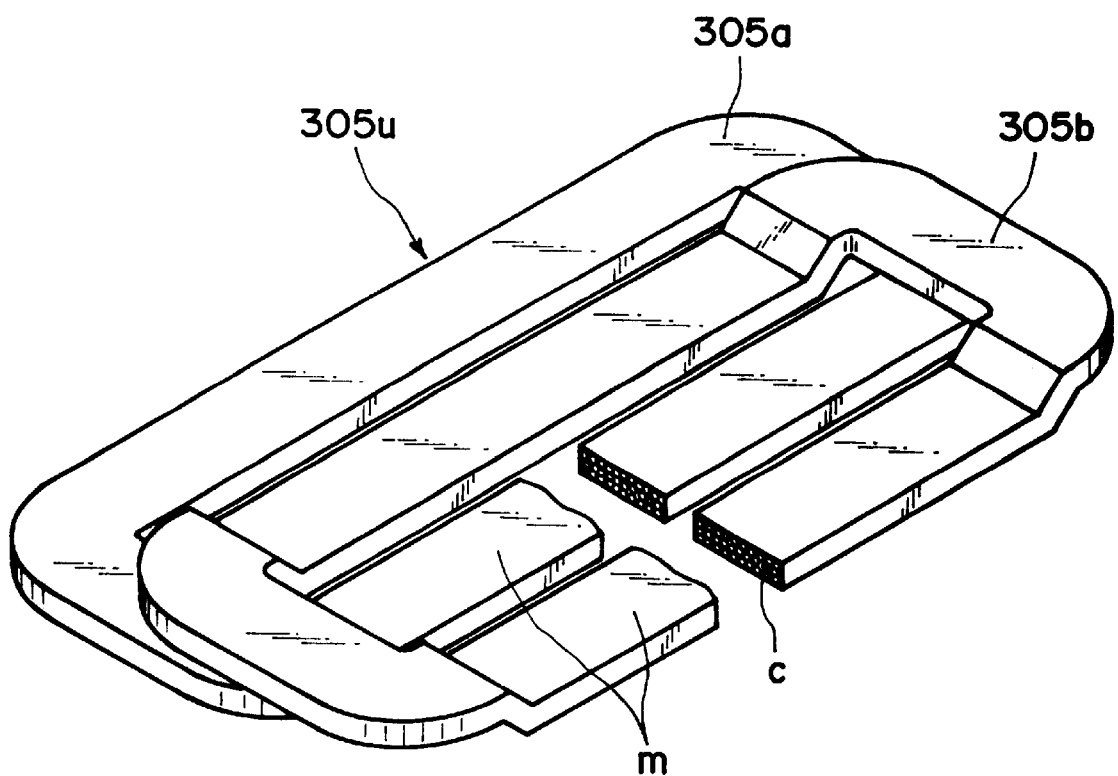
FIG. 21 is a perspective view of a single unit coil used in the linear motor of FIG. 20A.

FIGS. 1A and 1B show an example of a linear motor having unit coils Cu each being provided by a phase-A flat coil Ca and a phase-B flat coil Cb with a level difference, having been manufactured in the manner described above. The linear motor 1 of this embodiment differs from the linear motor 301 shown in FIG. 20A or 20B in the points of the coil producing process and the sectional shape of the element wire. However, the remaining structure and shape as well as the basic function are similar. Namely, while the sectional shape of the element wire of the coil in the linear motor 301 of FIG. 20A is circular, the section of the element wire of the flat coil Ca or Cb in the linear motor 1 of FIG. 1A is an oblong shape having a very high aspect ratio.

In FIGS. 1A and 1B, a stage 10 on which a workpiece 12, for example, is to be placed, is slidably supported on a guide 11 fixedly mounted on a base (not shown), for sliding motion along the driving direction. The stage 10 can be moved in the driving direction by means of linear motors 1 disposed on the opposite sides of the stage 10. Movable elements 3 of the linear motors 1 each comprises a four-pole magnet 6, being magnetized vertically, which is connected to the stage 10 through a supporting member 7. As regards stators 2 of the linear motors 1, coil units Cu each comprising a phase-A flat coil Ca and a phase-B flat coil Cb with a level difference, are disposed and juxtaposed to a laminated yoke 4 (4a and 4b), to provide a stator unit. There are such stator units disposed above and below the magnet 6, and they are fixedly supported by a base, not shown, through supporting means (not shown).

As described above, there is no necessity of forming a coil with level difference through a coil bending work. Therefore, the coil production procedure can be made simple. Since no stress is applied to the coil, a decrease of insulation reliability or breakage of wire can be prevented. The reliability of the coil itself can be increased. Thus, the inconveniences involved in the coil bending work, other than that attributable to the coil number, can be avoided.

While, in this embodiment, a phase-A flat coil and a phase-B flat coil with a level difference are used in combination, the present invention is not limited to this. Both of them may be coils with a level difference.

[Embodiment 2]

A second embodiment of the present invention will be described with reference to FIGS. 7A and 7B.

Figure 7A:
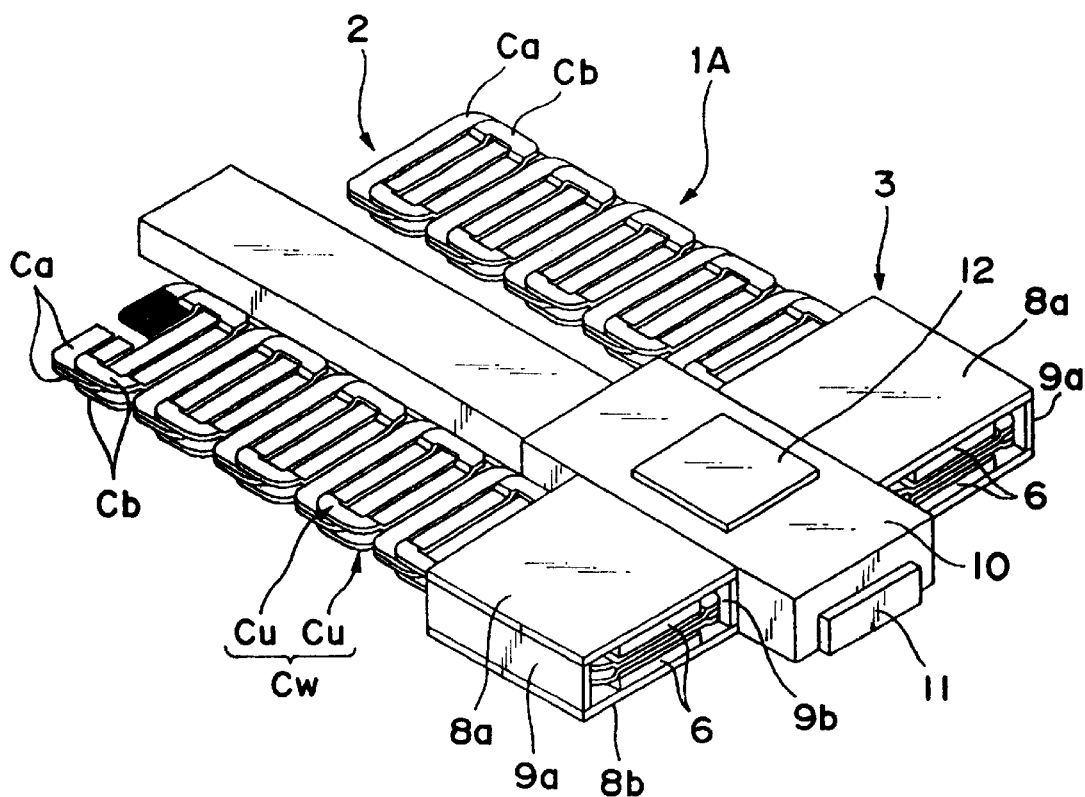
FIG. 7A is a perspective view of a linear motor according to a second embodiment of the present invention.
Figure 22A:
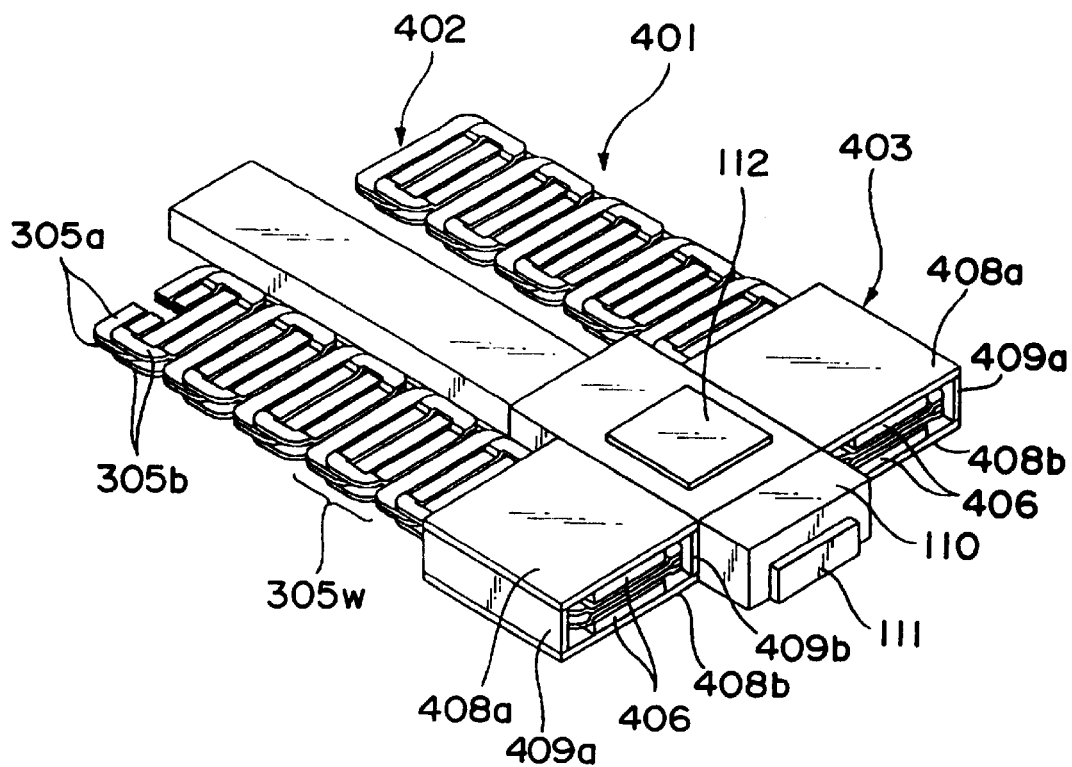
FIG. 22A is a perspective view of a linear motor of a known type.
Figure 22B:
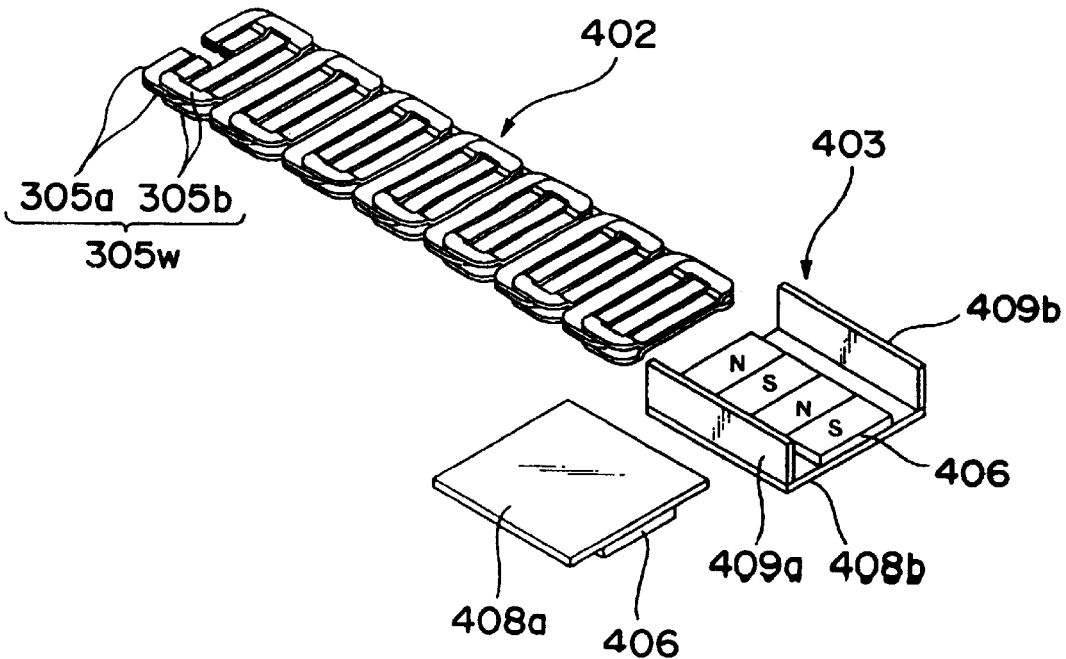
FIG. 22B is a perspective view schematically illustrating a stator and a movable element of the linear motor.

A linear motor 1A shown in FIG. 7A has such a structure that a double-coil unit 305w of the linear motor 401 of FIG. 22A is replaced by a double-coil unit Cw having unit coils Cu shown in FIG. 5. the basic function and operation as a linear motor are similar.

More specifically, in this embodiment, coplanar yoke side faces of unit coils Cu as shown in FIG. 5 are adhered with each other to provide a double-coil unit Cw, and such double-coil units Cw are juxtaposed with each other along the driving direction. They are connected together by fixing means (not shown) such as a stator frame, for example, whereby a stator 2 is provided. As regards movable elements 3, as shown in FIG. 7B, an upper yoke 8a and a lower yoke 8b, having four-pole magnets 6, are connected to each other through side plates 9a and 9b so that their magnets are opposed to each other. whereby a box-like movable element is provided. These movable elements are connected to the opposite sides of the stage 10.

Also, in this embodiment, the inconveniences involved in the coil bending work, other than that attributable to the coil number, can be avoided.

Also, in this embodiment, like the preceding embodiment, after the slicing of the roll coil through wire cutting, the section of a coil may be treated by etching, to effectively remove any flash between layers due to the slicing or short circuit between layers due to cut particles. Further, an insulating treatment may be made to the section having the short circuit removed, by applying an insulative resin to the section or by adhering an insulating tape thereto, for example. Thereafter, lead wires (not shown) may be bonded, by soldering, for example, to a winding start portion of the conductive foil, placed at an inner circumferential portion of the coil, and to a winding end portion of the foil placed at an outer circumferential portion of the coil, respectively. By this, a single coil is completed.

Figure 8:
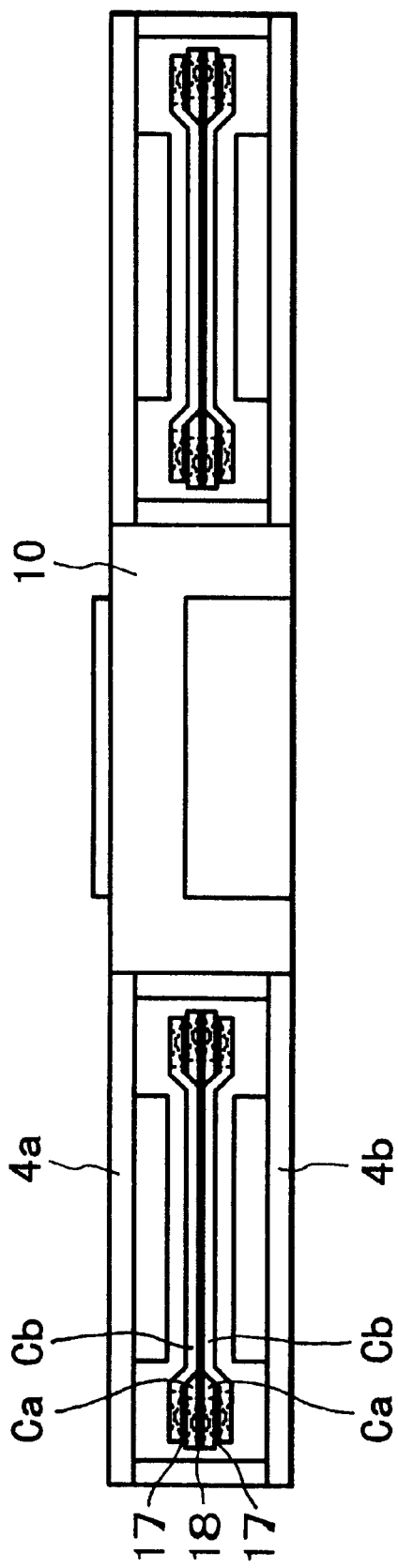
FIG. 8 is a side view of the linear motor of FIG. 7A, as seen in the movement direction thereof.

In a linear motor as in this embodiment, the dual-phase coils (phase-A flat coil Ca and phase-B flat coil Cb) are disposed while their portions, other than their magnet side faces, overlap with each other. Thus, at the R portions on the opposite ends of the coil, two coils are opposed to each other. For this reason, the insulating treatment to those portions where a phase-A flat coil Ca and a phase-B flat coil Cb are opposed to each other, is particularly important to prevent a short circuit between the phases A and B. Thus, in addition to the application of an insulative resin coating or adhesion of an insulating tape to the section of the coil described above, as shown in FIG. 8, an insulating plate 17 of a resin material, for example, having a thickness of 0.2 mm or more, may preferably be inserted between the phases A and B, for complete insulation. Namely, the insulating plate 17 of resin, for example, to be inserted between the phases A and B may well be formed with a thickness and a material sufficient for electrically insulating the phases A and B from each other. In regard to the straight portion of the coil, if coils are disposed opposed to each other as shown in FIG. 8, in addition to the insulating coating, for example, similarly, an insulating plate 18 may preferably be provided between the coils. As described, in the case of a coil with a level difference, there is a level difference between the straight portion of the coil and the R portion at an end thereof and, therefore, two types of insulating plates 17 and 18 may be provided separately.

[Embodiment 3]

Figure 9A:
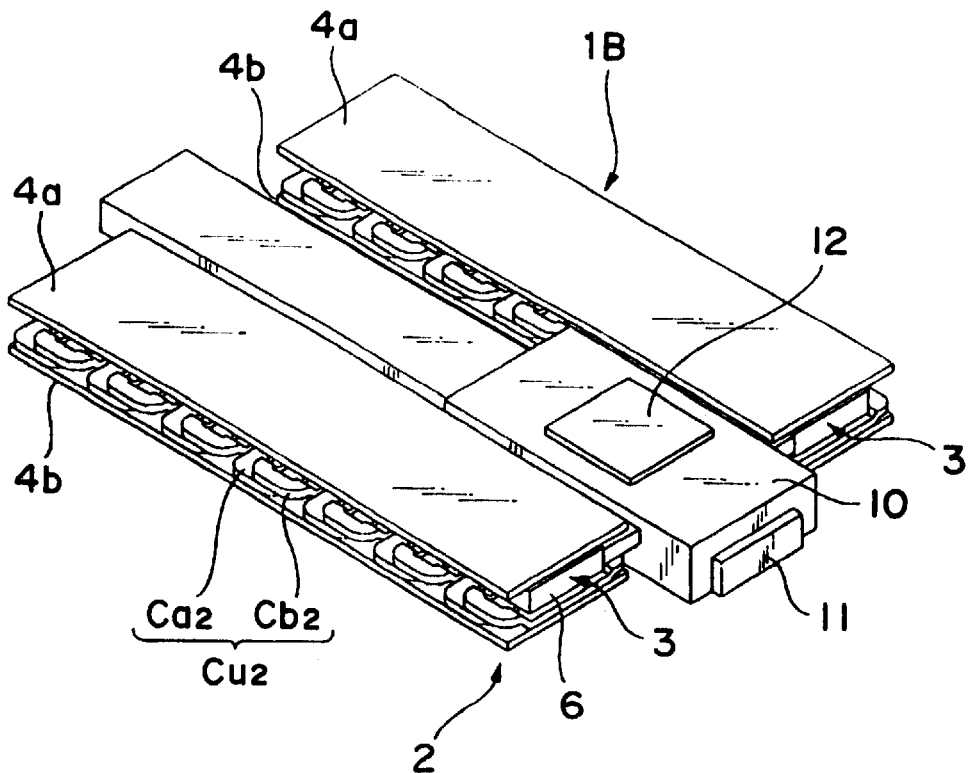
FIG. 9A is a perspective view of a linear motor according to a third embodiment of the present invention.
Figure 9B:
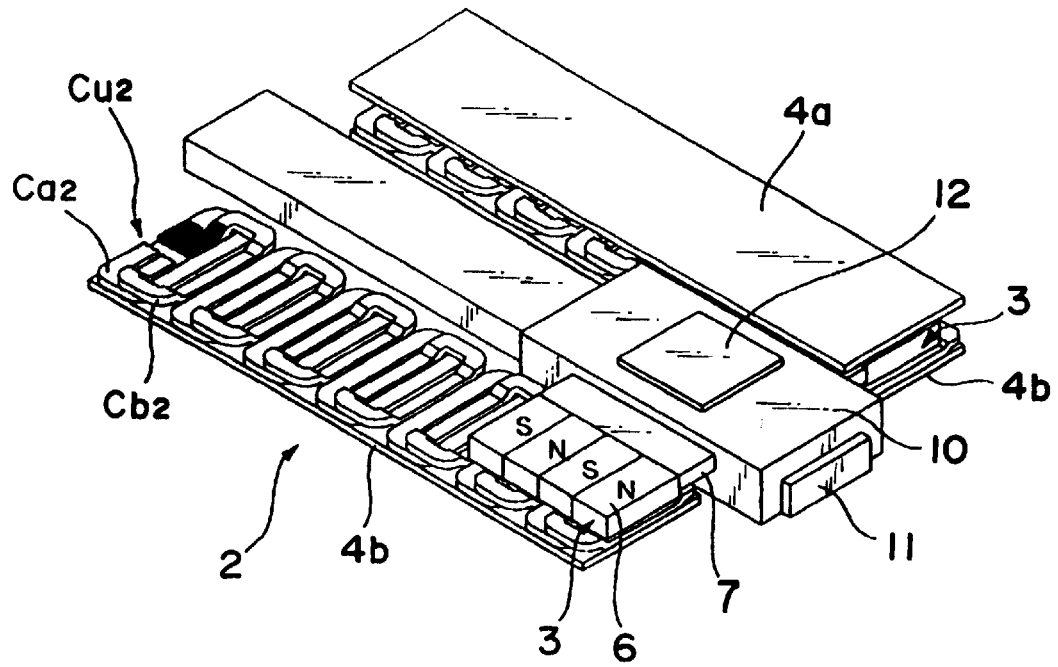
FIG. 9B is a perspective view wherein a portion of the linear motor is omitted in illustration.
Figure 10:
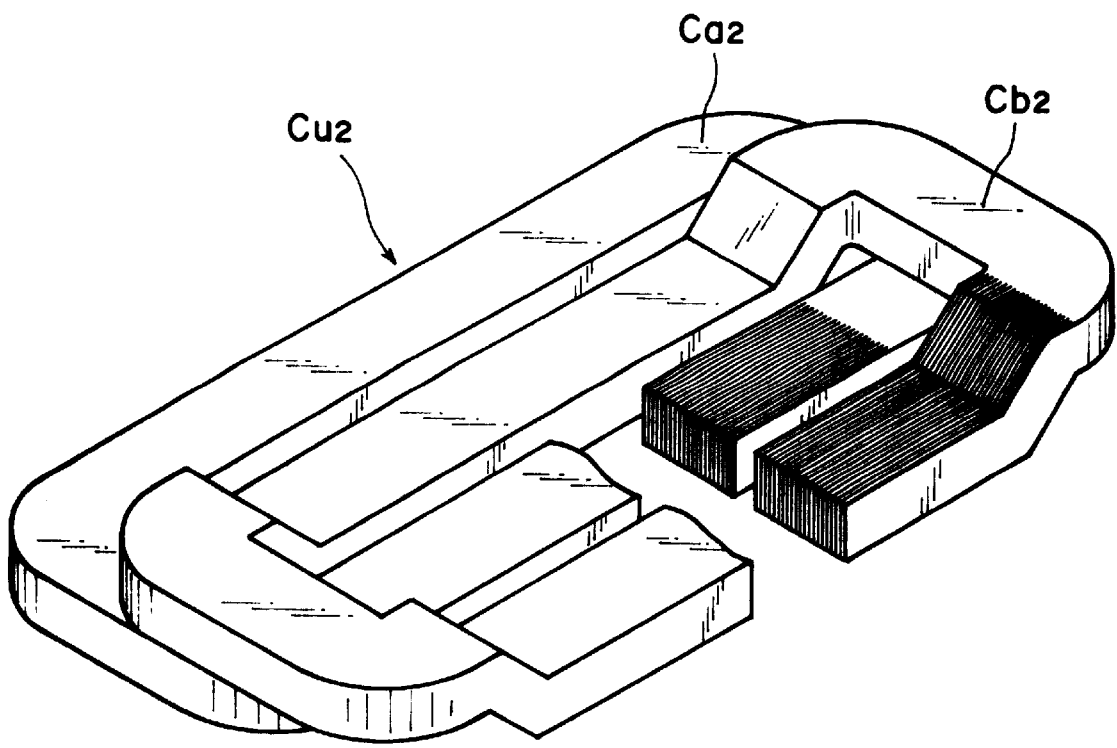
FIG. 10 is a perspective view of a unit coil to be used in a linear motor according to the third embodiment of the present invention.

A third embodiment of the present invention will be described with reference to FIGS. 9A, 9B and 10. This embodiment is a modified form of the first embodiment shown in FIGS. 1A and 1B. In the first embodiment, stator units each having unit coils Cu (FIG. 5) of a small thickness are arrayed and juxtaposed to upper and lower yokes 4a and 4b and are disposed to vertically sandwich the movable magnet 6 therebetween, whereas in this embodiment, as shown in FIG. 10, phase-A flat coils Ca2 and phase-B coils Cb2 of thicknesses twice those of the flat coils Ca and Cb of FIG. 5, are sliced from the roll coil r. These coils are disposed with a mutual shift of 90 deg., by which a unit coil Cu2 is provided. While thick coil units Cu2 are juxtaposed to a lower yoke 4b, there is no coil for an upper yoke 4a. The yokes are fixed so as to vertically sandwich a movable magnet 6 therebetween.

As regards the phase-A flat coil Ca2 and the phase-B flat coil Cb2, a coil of a desired thickness can be produced in accordance with the coil cutting method such as shown in FIGS. 4A–4C or FIGS. 3A–3C, by appropriately setting the spacing between adjacent wire paths p0 (FIG. 4A) and the spacing between the wire paths p1 and p2 (FIG. 3A). Thus, there is no limitation to the thickness. A thick phase-A flat coil Ca2 as well as a thick phase-B coil with a level difference as shown in FIG. 10 can be produced.

Also, in this embodiment, like the preceding embodiments, after the slicing of the roll coil through wire cutting, the section of a coil may be treated by etching, to effectively remove any flash between layers due to the slicing or short circuit between layers due to cut particles. Further, an insulating treatment may be made to the section having the short circuit removed, by applying an insulative resin to the section or by adhering an insulating tape thereto, for example. Thereafter, lead wires (not shown) may be bonded, by soldering, for example, to a winding start portion of the conductive foil, placed at an inner circumferential portion of the coil, and to a winding end portion of the foil placed at an outer circumferential portion of the coil, respectively. By this, a single coil is completed.

Figure 11:
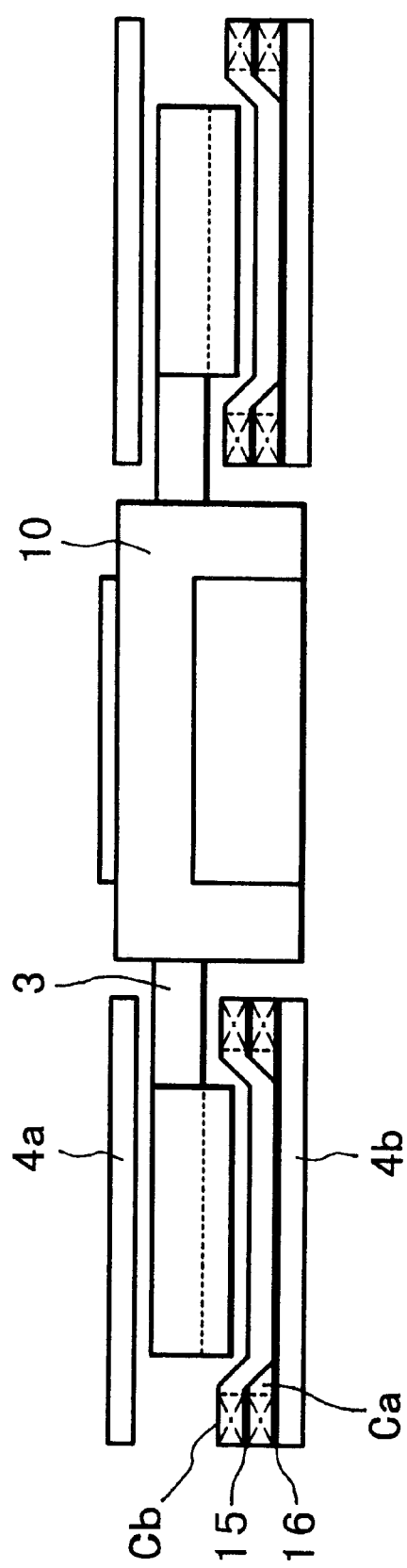
FIG. 11 is a side view of the linear motor of FIG. 10, as seen in the movement direction thereof.

In a linear motor as in this embodiment, the dual-phase coils (phase-A flat coil Ca and phase-B flat coil Cb) are disposed while their portions, other than their magnet side faces, overlap with each other. Thus, at the R portions on the opposite ends of the coil, two coils are opposed to each other. For this reason, the insulating treatment to those portions where a phase-A flat coil Ca and a phase-B flat coil Cb are opposed to each other, is particularly important to prevent a short circuit between the phases A and B. Thus, in addition to the application of an insulative resin coating or adhesion of an insulating tape to the section of the coil described above, as shown in FIG. 11, an insulating plate 15 of a resin material, for example, having a thickness of 0.2 mm or more, may preferably be inserted between the phases A and B, for complete insulation. Namely, the insulating plate 15 of resin, for example, to be inserted between the phases A and B may well be formed with a thickness and a material sufficient for electrically insulating the phases A and B from each other. In regard to the straight portion of the coil, coils are disposed opposed to each other as shown in FIG. 11, in addition to the insulating coating, for example. Similarly, an insulating plate 16 may preferably be provided between the coils. As described, in the case of a coil with a level difference, there is a level difference between the straight portion of the coil and the R portion at an end thereof and, therefore, two types of insulating plates 15 and 16 may be provided separately.

In this embodiment, in addition to the advantageous effects of the first embodiment, the number of coils can be reduced. Therefore, there is an advantage of reduction in the number of coil assembling works and connection works.

[Embodiment 4]

Figure 12:
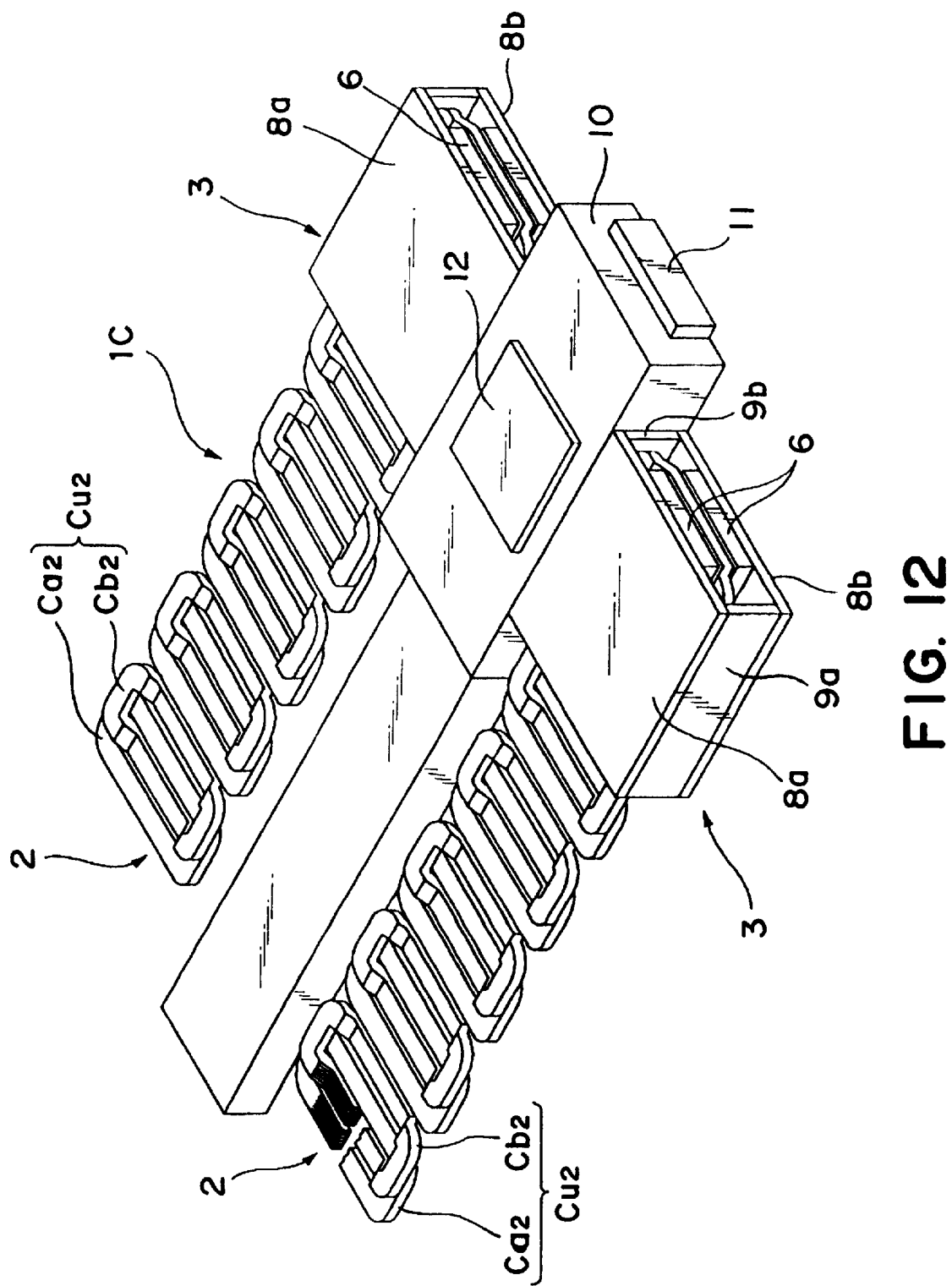
FIG. 12 is a perspective view of a linear motor according to a fourth embodiment of the present invention.

A fourth embodiment of the present invention will be described with reference to FIG. 12. This embodiment is a modified form of the second embodiment shown in FIGS. 7A and 7B. In the second embodiment, unit coils of a small thickness are adhered to each other to provide a double-coil unit Cw, and such double-coil units Cw are juxtaposed along the driving direction. They are fixed together by fixing means (not shown) such as a stator frame, for example, whereby a stator 2 is provided. In this embodiment, on the other hand, in place of such a double-coil unit Cw, unit coils Cu2 of a large thickness such as shown in FIG. 10 are used singly, without adhesion. The remaining structure of this embodiment is similar to the second embodiment of FIGS. 7A and 7B.

Also, in this embodiment, as regards the phase-A flat coil Ca2 and the phase-B flat coil Cb2, a coil of a desired thickness can be produced in accordance with the coil cutting method such as shown in FIGS. 4A–4C or FIGS. 3A–3C, by appropriately setting the spacing between adjacent wire paths p0 (FIG. 4A) and the spacing between the wire paths p1 and p2 (FIG. 3A). Thus, there is no limitation to the thickness. A thick phase-A flat coil Ca2 as well as a thick phase-B coil with a level difference as shown in FIG. 10 can be produced.

Figure 7B:
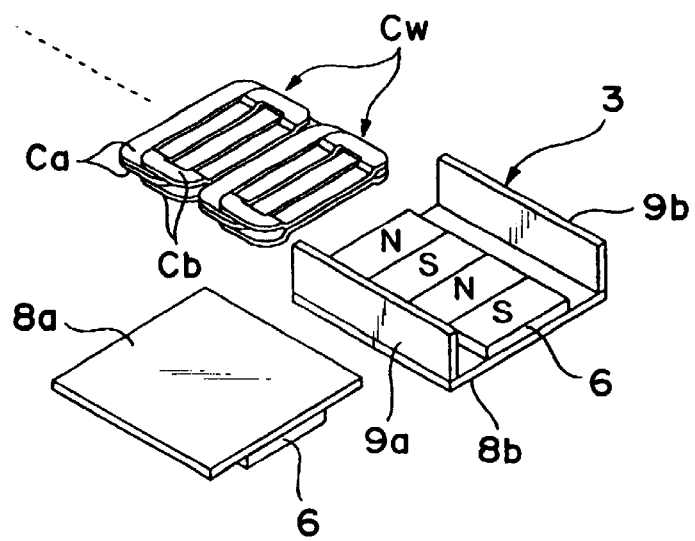
FIG. 7B is a perspective view of a moving element of the linear motor.

In this embodiment, in addition to the advantageous effects of the second embodiment of FIGS. 7A and 7B, the number of coils can be reduced. Therefore, there is an advantage of reduction in the number of coil assembling works and connection works.

[Embodiment 5]

A fifth embodiment of the present invention will be described. A feature of this embodiment resides in the manner of making a phase-B flat coil having a level difference. Details will be described with reference to FIGS. 13A, 13B and 13C.

As has been described with reference to FIG. 2, first, a sheet-like conductive foil f having an insulating treatment and a thermo-setting adhesive agent application treatment applied to its opposite surfaces, is wound around a core (not shown) by a predetermined number of turns, by which a roll coil r is provided. The core is then removed from the roll coil r. Subsequently, heat is applied to it, by which layers of conductive foil are adhered with each other due to the thermo-setting adhesive agent and, as a result, the foil layers are bonded together integrally.

Figure 13A:
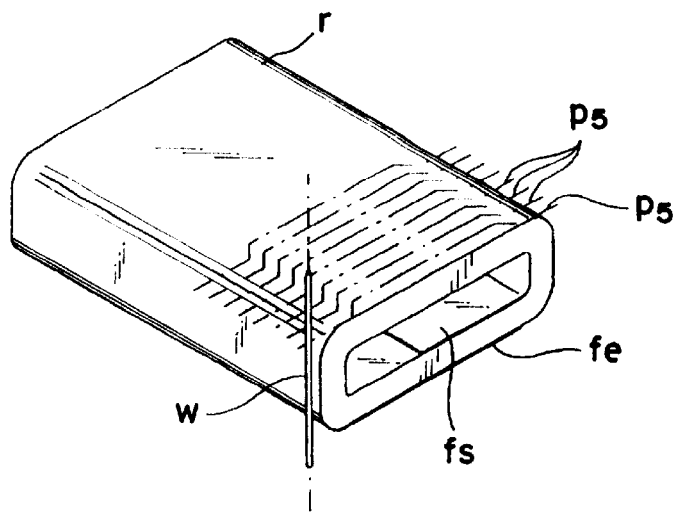
FIGS. 13A, 13B and 13C are perspective views, respectively, for explaining a process for producing a phase-B flat coil with a level difference, from a roll coil, in accordance with a fifth embodiment of the present invention.
Figure 13B:
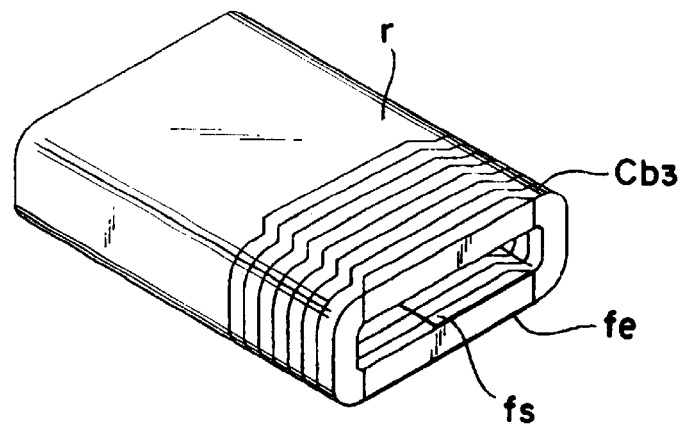

Then, as shown in FIG. 13A, the roll coil r is introduced into a wire-cutting machine (not shown) so that the wire w of the wire-cutting machine extends substantially parallel to a side of the roll coil r. Then, as shown in FIG. 13A, the wire w is moved along a sole wire path p5 to cut the roll coil r. Thereafter, similar operations are repeated while setting the spacing between adjacent wire paths p5 to a value corresponding to the thickness t1 of the coil straight portion, to cut the roll coil r. This can be done, as shown in FIG. 13C, by designing the phase-B flat coil Cb3 so that the yoke side face length ly of the yoke side face y and the magnet side face length lm of the magnet side face a are equal to each other.

Figure 13C:
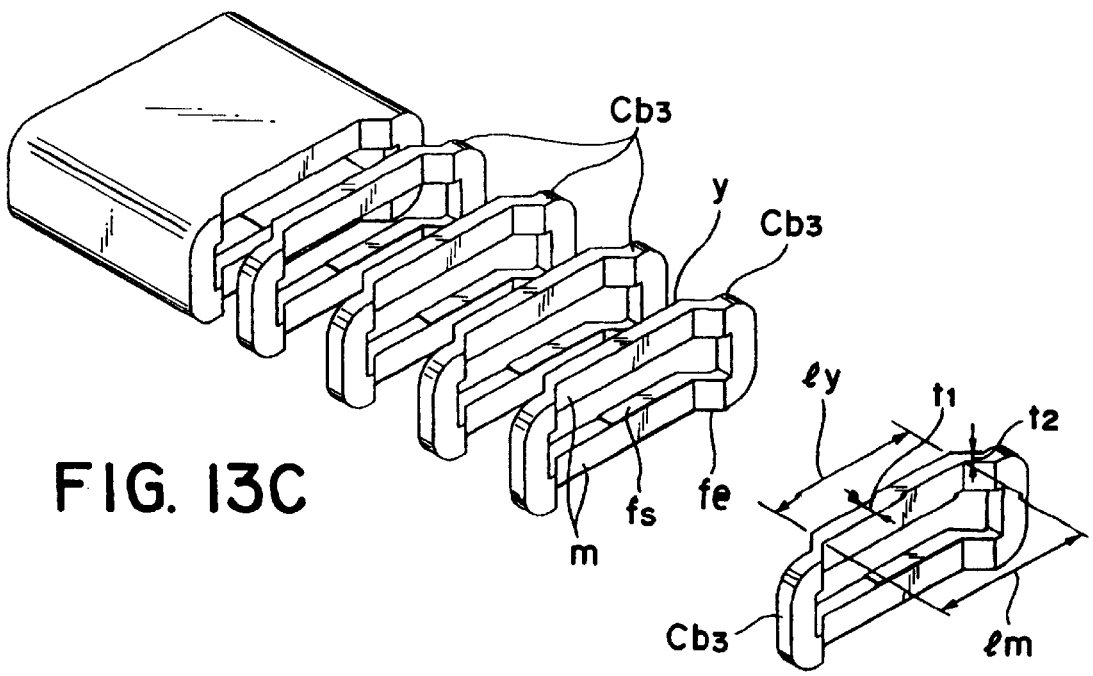

As a result of these operations, as shown in FIG. 13C, only phase-B flat coils Cb3 having a thickness t2 at the coil curved or bent portion which is slightly smaller than the thickness t1 at its straight portion, are sliced. Because the thickness t2 of the bent portion is slightly smaller than the straight portion thickness t1, the resistance increases accordingly and, thus, heat generation increases. In place of it, there is no unnecessary portion Cx (FIGS. 3A–3C) produced. Thus, almost all the material can be used for phase-B flat coils Cb3, and there is substantially no waste of material.

After the slicing of the roll coil through wire cutting, the section of a coil may be treated by etching, to effectively remove any flash between layers due to the slicing or short circuit between layers due to cut particles. Further, an insulating treatment may be made to the section having the short circuit removed, by applying an insulative resin to the section or by adhering an insulating tape thereto, for example. Thereafter, lead wires (not shown) may be bonded, by soldering, for example, to a winding start portion of the conductive foil, placed at an inner circumferential portion of the coil, and to a winding end portion of the foil placed at an outer circumferential portion of the coil, respectively, By this, a single coil is completed.

For example, in a phase-B flat coil Cb, after the slicing, an insulating treatment may be made to the sectional face of the phase-B flat coil Cb, and lead wires (not shown) may be bonded, by soldering, for example, to a winding start portion fa of the conductive foil f, placed at an inner circumferential portion of the phase-B flat coil Cb, and to a winding end portion fe of the foil f placed at an outer circumferential portion of the coil, respectively. By this, a single structure of phase-B flat coil is completed.

In a dual-phase linear motor as in this embodiment, the dual-phase coils (phase-A flat coil Ca and phase-B flat coil Cb) are disposed while their portions, other than their magnet side faces, overlap with each other. Thus, at the R portions on the opposite ends of the coil, two coils are opposed to each other. For this reason, the insulating treatment to those portions where a phase-A flat coil Ca and a phase-B flat coil Cb are opposed to each other, is particularly important to prevent a short circuit between the phases A and B Thus, in addition to the application of an insulative resin coating or adhesion of an insulating tape to the sliced sectional face of the coil described above, as shown in FIG. 6, an insulating plate of a resin material, for example, having a thickness of 0.2 mm or more, may preferably be inserted between the phases A and B, for complete insulation. Namely, the insulating plate of resin, for example, to be inserted between the phases A and B may well be formed with a thickness and a material sufficient for electrically insulating the phases A and B from each other. In regard to the straight portion of the coil, if it is to be opposed to a yoke such as shown in FIG. 1A or 1B, in addition to the insulating coating, for example, similarly, an insulating plate may preferably be provided between the yoke and the coil. As described, in the case of a coil with a level difference, there is a level difference between the straight portion of the coil and the R portion at an end thereof and, therefore, two types of insulating plates may be provided separately.

A phase-B flat coil Cb3 produced in accordance with this embodiment can be applied to all the linear motors of the preceding embodiments.

This embodiment provides peculiar advantageous effects such as an effective use of the material which leads to a decreased material cost. Further, only one wire path is necessary in the wire cutting machine, and the machining cost can be reduced. Also, since phase-B flat coils of this embodiment can be disposed one upon another without spacing, phase-B coils Cb3 sliced with a small thickness can be put together while their magnet side face m and yoke side face y are opposed to each other to provide an equivalently thick coil. With the shape of the phase-B flat coil Cb produced in accordance with the method shown in FIGS. 3A–3C, only the yoke side faces of the coils can be opposed to each other. Therefore, only two coils can be put one upon another. With the shape of the phase-B flat coil Cb3 of this embodiment, to the contrary, a desired number of coils can be put one upon another. Further, since there is no unnecessary portion produced, waste of the material is reduced.

[Embodiment 6]

A sixth embodiment of the present invention will be described. A feature of this embodiment resides in the manner of making a phase-B flat coil having a level difference. Details will be described with reference to FIGS. 14A, 14B and 14C.

As has been described with reference to FIG. 2, first, a sheet-like conductive foil f having an insulating treatment and a thermo-setting adhesive agent application treatment applied to its opposite surfaces, is wound around a core (not shown) by a predetermined number of turns, by which a roll coil r is provided. The core is then removed from the roll coil r. Subsequently, heat is applied to it, by which layers of conductive foil are adhered with each other due to the thermo-setting adhesive agent and, as a result, the foil layers are bonded together integrally.

Figure 14A:
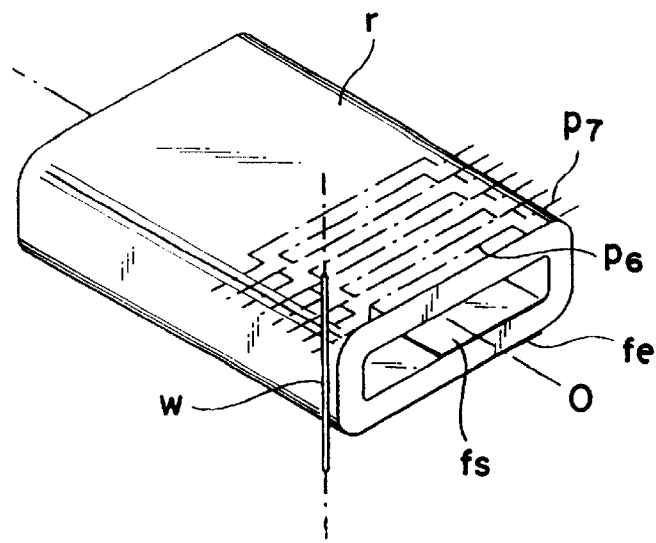
FIGS. 14A, 14B and 14C are perspective views, respectively, for explaining a process for producing a phase-B flat coil with a level difference, from a roll coil, in accordance with a sixth embodiment of the present invention.
Figure 14B:
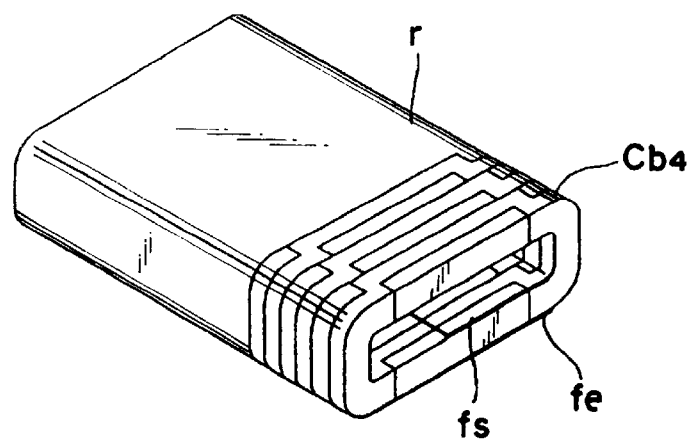
Figure 14C:
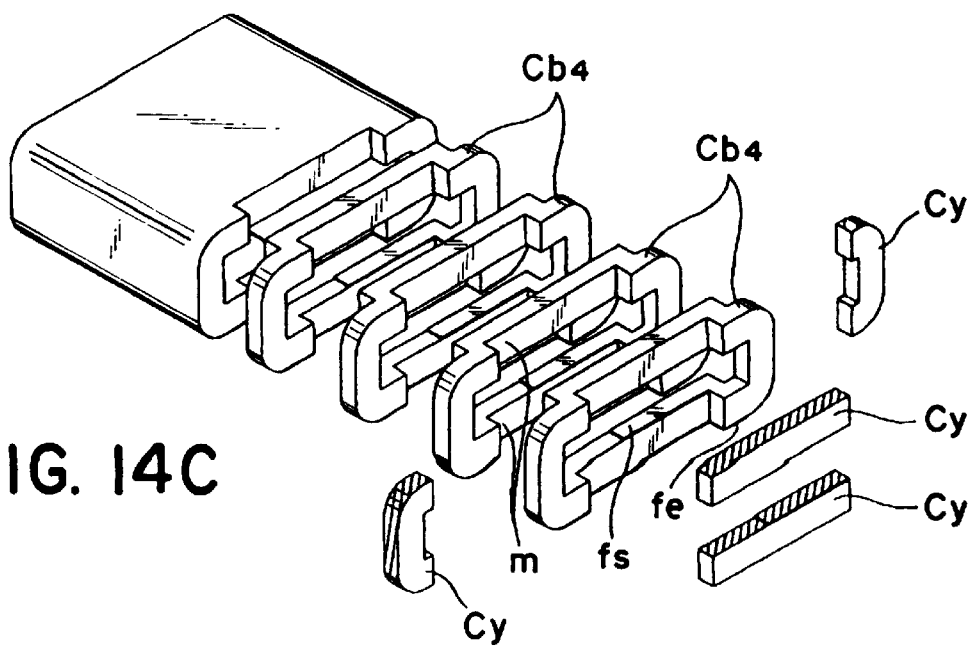

Then, as shown in FIG. 14A, the roll coil r is introduced into a wire-cutting machine (not shown) so that the wire w of the wire-cutting machine extends substantially parallel to a side of the roll coil r. Then, as shown in FIG. 14A, the wire w is moved along a first wire path p6 and a second wire path p7 to cut the roll coil r. Thereafter, similar operations are repeated sequentially, to cut the roll coil r. In this embodiment, the first and second wire paths p6 and p7 are so set that the sliced sectional faces are defined only by a plane perpendicular to the coil central axis o and a plane parallel to the coil central axis. The spacing between the wire paths corresponds to the coil thickness.

With the operations described above, phase-B flat coils Cb4 each having sections defined only by surfaces perpendicular to and parallel to the coil central axis o, as well as four unnecessary portions Cy per one phase-B flat coil Cb4, are sliced. The unnecessary portions Cy are not used.

After the slicing of the roll coil through wire cutting, the section of a coil may be treated by etching, to effectively remove any flash between layers due to the slicing or a short circuit between layers due to cut particles. Further, an insulating treatment may be made to the section having the short circuit removed, by applying an insulative resin to the section or by adhering an insulating tape thereto, for example. Thereafter, lead wires (not shown) may be bonded, by soldering, for example, to a winding start portion of the conductive foil, placed at an inner circumferential portion of the coil, and to a winding end portion of the foil placed at an outer circumferential portion of the coil, respectively. By this, a single coil is completed.

For example, in a phase-B flat coil Cb4, after the slicing, an insulating treatment may be made to the sectional face of the phase-B flat coil Cb4, and lead wires (not shown) may be bonded, by soldering, for example, to a winding start portion fs of the conductive foil f, placed at an inner circumferential portion of the phase-B flat coil Cb4, and to a winding end portion fe of the foil f placed at an outer circumferential portion of the coil, respectively. By this, a single structure of phase-B flat coil Cb4 is completed.

In a dual-phase linear motor as in this embodiment, the dual-phase coils (phase-A flat coil Ca and phase-B flat coil Cb) are disposed while their portions, other than their magnet side faces, overlap with each other. Thus, at the R portions on the opposite ends of the coil, two coils are opposed to each other. For this reason, the insulating treatment to those portions where a phase-A flat coil Ca and a phase-B flat coil Cb are opposed to each other, is particularly important to prevent a short circuit between the phases A and B. Thus, in addition to the application of an insulative resin coating or adhesion of an insulating tape to the sliced sectional face of the coil described above, as shown in FIG. 6, an insulating plate of a resin material, for example, having a thickness of 0.2 mm or more, may preferably be inserted between the phases A and B, for complete insulation. Namely, the insulating plate of resin, for example, to be inserted between the phases A and E may well be formed with a thickness and a material sufficient for electrically insulating the phases A and B from each other. In regard to the straight portion of the coil, if it is to be opposed to a yoke such as shown in FIGS. 1A, 1B, 9A or 9B, in addition to the insulating coating, for example, similarly, an insulating plate may preferably be provided between the yoke and the coil.

A phase-B flat coil Cb4 produced in accordance with this embodiment can be applied to all the linear motors of the preceding embodiments. Since a phase-B flat coil Cb4 of this embodiment has a larger area at its bent portion, as compared with the phase-B coil shown in FIG. 3A or 13A, there is a peculiar advantageous effect that the whole resistance can be decreased, such that heat generation can be reduced.

[Embodiment of Exposure Apparatus]

Figure 15:
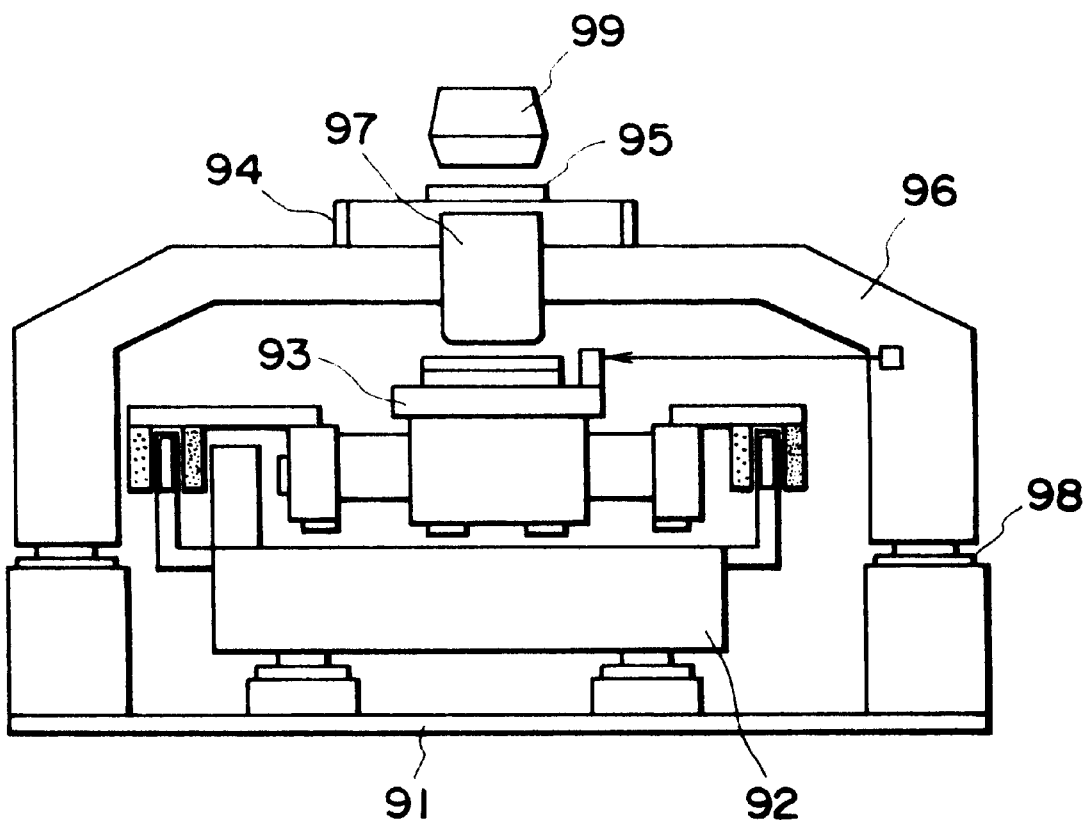
FIG. 15 is a schematic view of an exposure apparatus according to an embodiment of the present invention.

Referring now to FIG. 15, an embodiment of a scanning exposure apparatus having a stage system based on a linear motor system such as described with reference to the preceding embodiments, will be explained.

A barrel base 96 is supported by a floor or a base table 91, through dampers 98. The barrel base 96 functions to support a reticle base 94 and also to support a projection optical system 97 which is placed between a reticle stage 95 and a wafer stage 93.

The water stage is supported by a stage base which is supported by the floor or the base table, and it functions to position a wafer carried thereon. The reticle stage is supported by a reticle stage base which is supported by the barrel base, and it is movable while carrying thereon a reticle having a circuit pattern formed thereon. Exposure light, with which a wafer on the wafer stage 93 can be exposed to a reticle placed on the reticle stage 95, is produced from an illumination optical system 99.

The wafer stage 93 is scanningly moved in synchronism with the reticle stage 95. During the scan motion of the reticle stage 95 and the wafer stage 93, their positions are detected continuously by means of respective interferometers, and the detected positions are fed back to driving means for the reticle stage 95 and the wafer stage 93, respectively. This accomplishes accurate synchronization between scan start positions of these stages, as well as high precision control of the scan speed in a constant speed scan region. Through the scan motion of these stages relative to the projection optical system, the reticle pattern is projected onto the wafer and, thus, the circuit pattern is transferred to it.

In this embodiment, at least one of the reticle stage and the wafer stage uses the linear motor system such as described in the preceding embodiments. As a result, high speed and high precision exposure with reduced heat generation are accomplished.

[Semiconductor Device Manufacturing Method]

Next, an embodiment of a semiconductor device manufacturing method which uses an exposure apparatus such as described above, will be explained.

Figure 16:
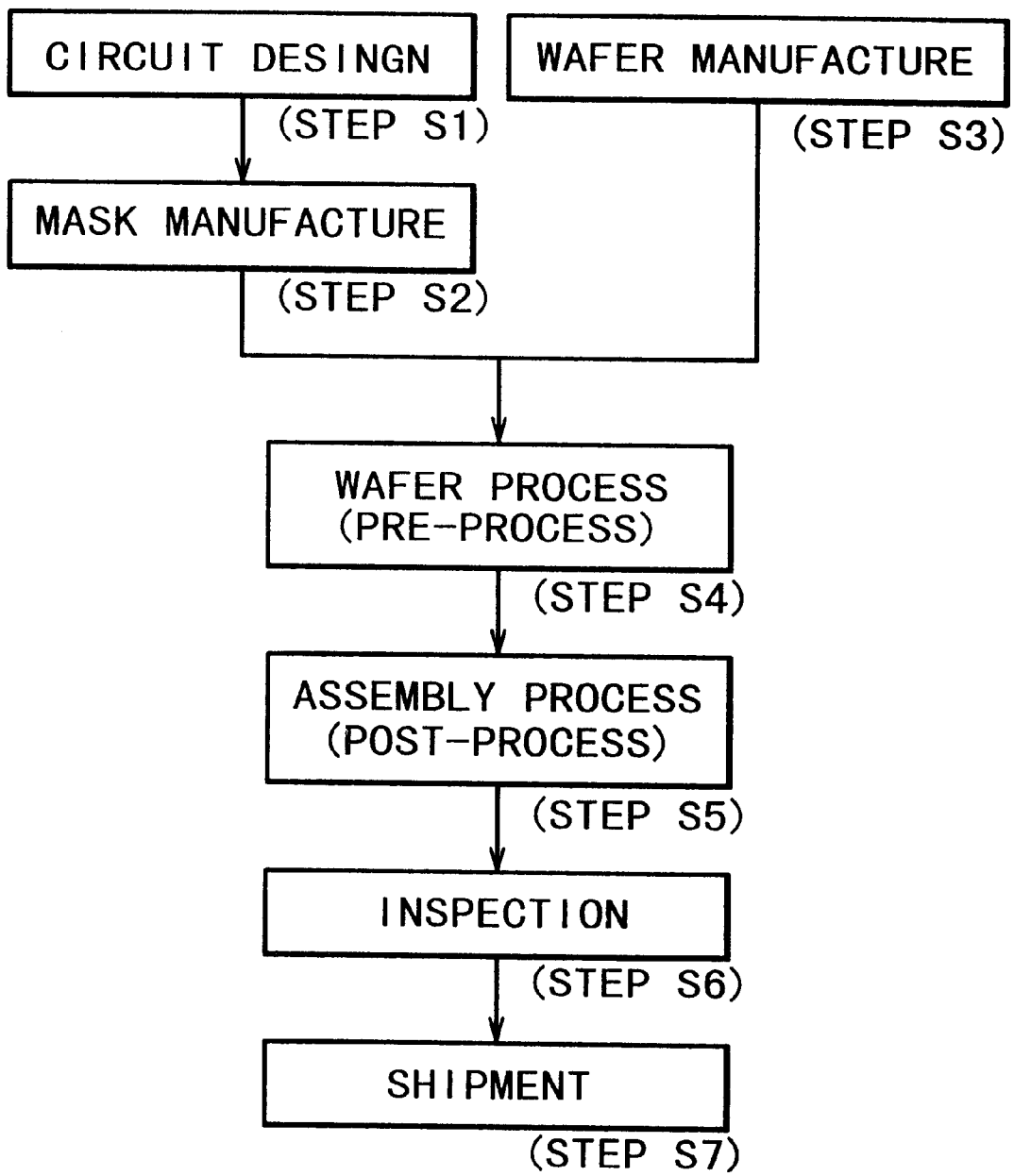
FIG. 16 in a flow chart of device manufacturing processes, in an embodiment of the present invention.

FIG. 16 is a flow chart of a procedure for the manufacture of inicrodevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check, and so on for the semiconductor devices provided by step 5, are carried out. With these processes, semiconductor devices are completed and they are shipped (step 7).

Figure 17:
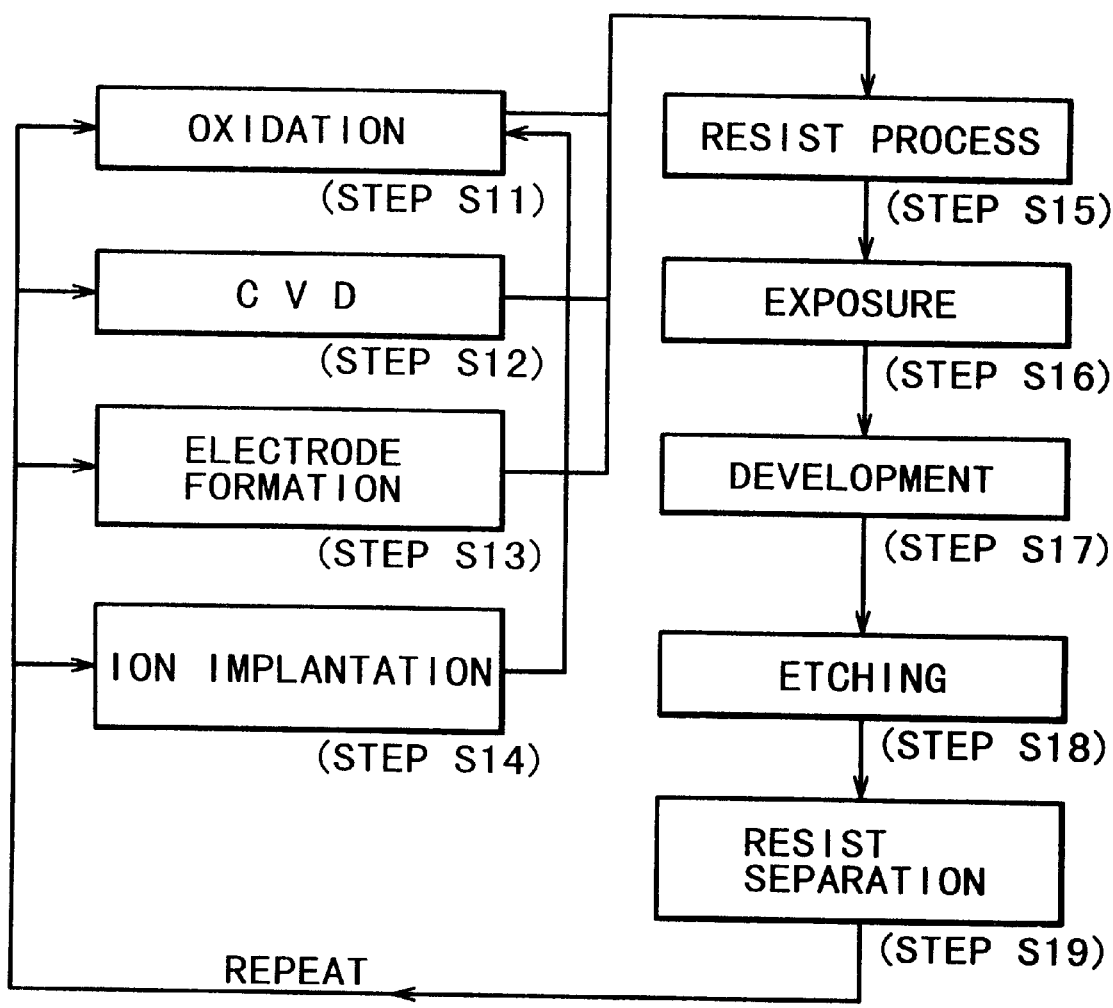
FIG. 17 is a flow chart of a wafer process, in the procedure of FIG. 16.
Figure 18A:
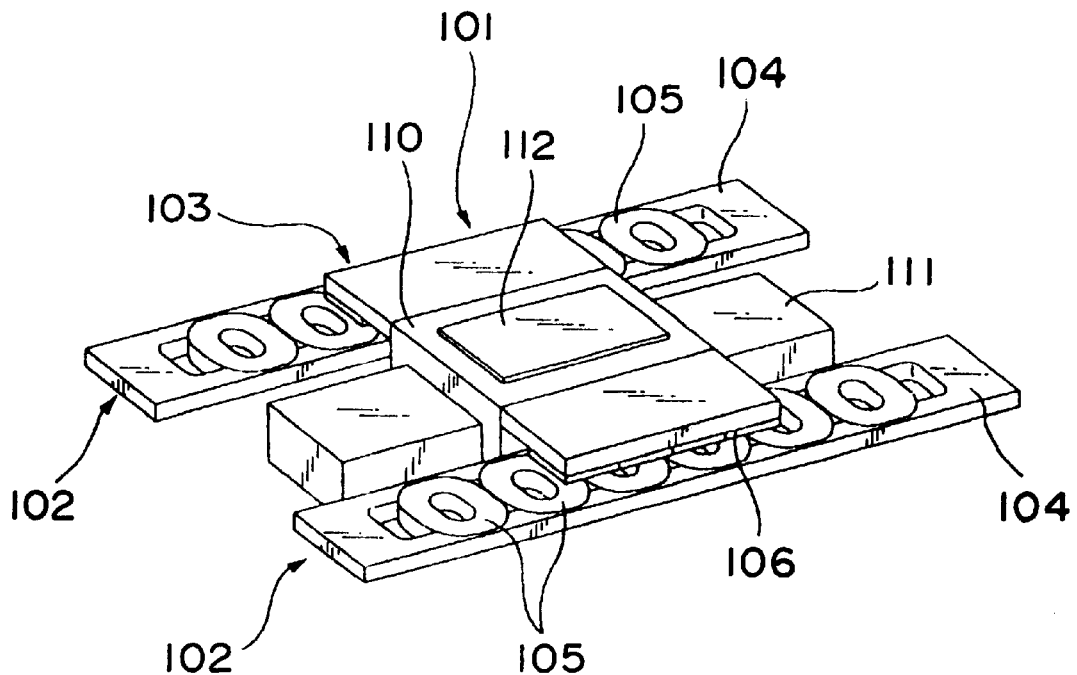
FIG. 18A is a perspective view of a linear motor of a known type.
Figure 18B:
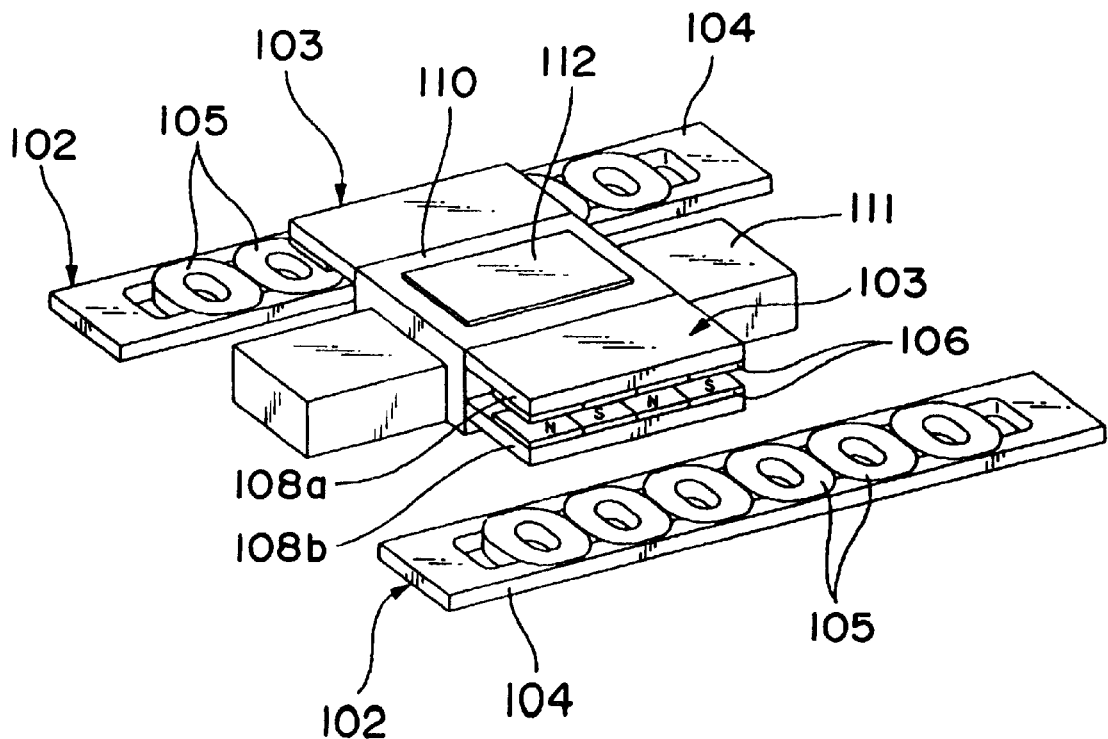
FIG. 18B is a perspective view for explaining a stator unit of the linear motor.
Figure 19A:
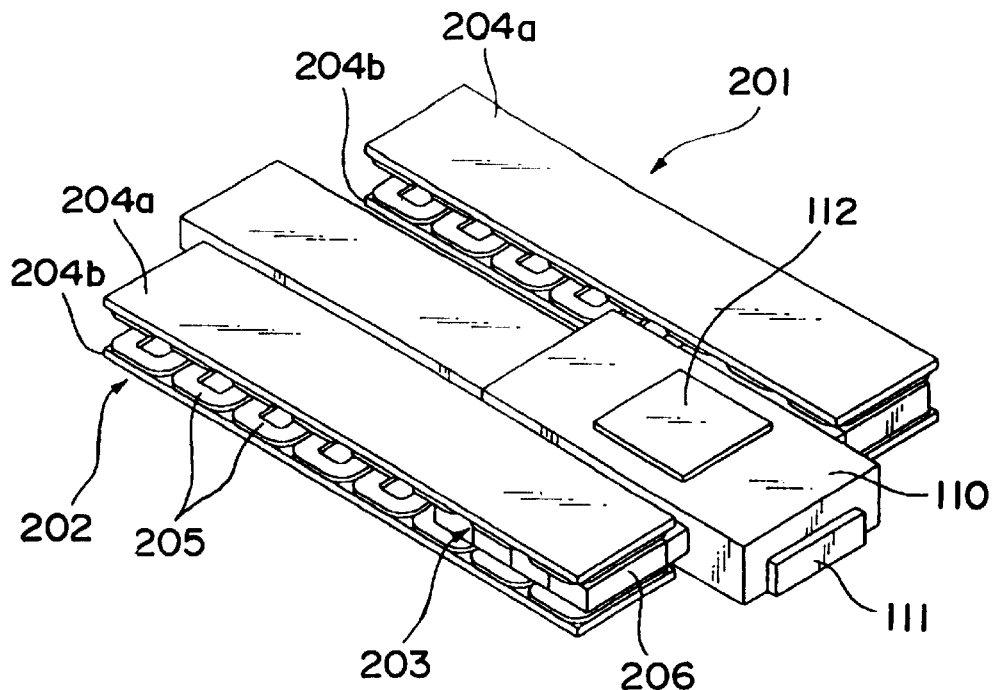
FIG. 19A is a perspective view of another example of a linear motor of a known type.
Figure 19B:
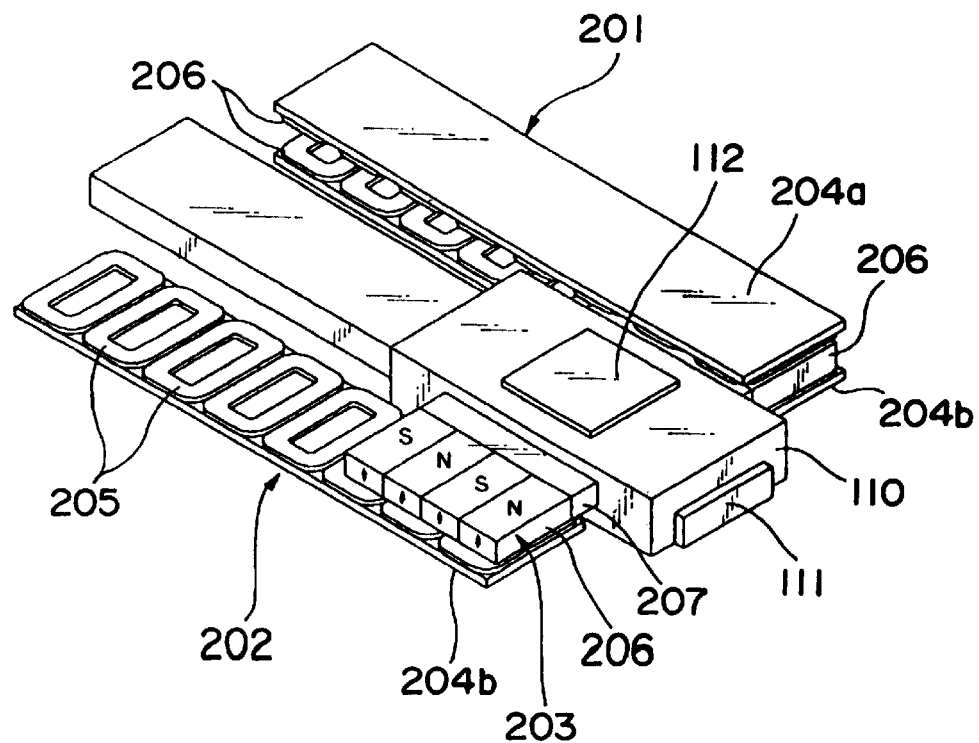
FIG. 19B is a perspective view wherein a portion of the linear motor is omitted in illustration.

FIG. 17 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, the number of working steps for a flat coil with a level difference can be reduced. Further, there is no possibility of breakage of a wire due to a stress applied to a coil. Thus, the reliability of the coil itself can be improved significantly. Further, a flat coil with a level difference having a large coil thickness can be produced, such that the number of components and the number of assembling works can be reduced significantly.

While the invention has been described with reference to the structures disclosed herein, it is not confined to the details set forth and this application is intended to cover such modifications or changes as may come within the purposes of the improvements or the scope of the following claims.

What is claimed is:

1. A method of producing a coil with a level difference, comprising the steps of:

winding a conductive foil into a roll to provide a roll coil; and slicing, by wire cutting, the roll coil so that a coil having a level difference formed thereon is produced.

2. A method according to claim 1, wherein the roll coil is sliced so that, in a coil produced by the slicing, a straight portion and a bent portion, for defining the level difference, have the same thickness.

3. A method according to claim 1 or 2, wherein the roll coil is sliced so that, in a coil produced by the slicing, the magnitude of the level difference formed is larger than the coil thickness.

4. A method according to any one of claims 1–2, further comprising etching a section of a coil produced by the slicing.

5. A method according to any one of claims 1–2, further comprising providing an insulating material at a section of a coil produced by the slicing.

6. A method according to any one of claims 1–2, further comprising providing an insulating material at a portion of a coil, of coils produced by the slicing, which portion is to be opposed to another coil.

7. A method according to claim 5, wherein the insulating material is provided through one of applying an insulating material, adhesion of an insulating tape and insertion of an insulating plate.

8. A coil with a level difference, said coil comprising:

a straight portion and a portion with the level difference, in which a conductive material for the coil has a shape defined by winding a conductive foil.

9. A coil with a level difference according to claim 8, wherein the coil is produced by slicing a roll coil provided by winding the conductive foil.

10. A coil with a level difference according to claim 9, wherein a section of the coil produced by the slicing is processed by etching.

11. A coil with a level difference according to claim 9 or 10, further comprising an insulating material provided at the section of the coil produced by the slicing.

12. A coil with a level difference according to claim 11, wherein the insulating material is provided through one of applying an insulating material, adhesion of an insulating tape and insertion of an insulating plate.

13. A coil with a level difference according to claim 12, wherein an insulating material is provided to prevent an electric short circuit between layers of the conductive foil.

14. A linear motor comprising a coil with a level difference as recited in claim 13.

15. A linear motor according to claim 14, further comprising a unit coil including at least two coils, each having a level difference, which are disposed with partial overlapping.

16. A linear motor according to claim 15, further comprising an insulating material provided at a portion where coils of the unit coil are opposed to each other.

17. A linear motor according to claim 16, wherein the coil unit is fixed to a yoke, and wherein an insulating material is provided between the coil and the yoke.

18. A linear motor according to claim 14, wherein a magnet is provided at a movable element side thereof while the coil is provided at a stator side thereof.

19. A linear motor according to claim 15, wherein a magnet is provided at a movable element side thereof while the coil is provided at a stator side thereof.

20. A linear motor according to claim 16, wherein a magnet is provided at a movable element side thereof while the coil is provided at a stator side thereof.

21. A linear motor according to claim 17, wherein a magnet is provided at a movable element side thereof while the coil is provided at a stator side thereof.

22. A stage system having a linear motor as recited in claim 18.

23. A stage system having a linear motor as recited in claim 19.

24. A stage system having a linear motor as recited in claim 20.

25. A stage system having a linear motor as recited in claim 21.

26. An exposure apparatus having a stage system as recited in claim 22, and being used for at least one of a reticle stage and a wafer stage.

27. An exposure apparatus having a stage system as recited in claim 23, and being used for at least one of a reticle stage and a wafer stage.

28. An exposure apparatus having a stage system as recited in claim 24, and being used for at least one of a reticle stage and a wafer stage.

29. An exposure apparatus having a stage system as recited in claim 25, and being used for at least one of a reticle stage and a wafer stage.

30. A device manufacturing method, comprising the steps of:

providing an exposure apparatus as recited in claim 26; and transferring a pattern formed on a reticle onto a wafer by use of the exposure apparatus.

31. A device manufacturing method, comprising the steps of:

providing an exposure apparatus as recited in claim 27; and transferring a pattern formed on a reticle onto a wafer by use of the exposure apparatus.

32. A device manufacturing method, comprising the steps of:

providing an exposure apparatus as recited in claim 28; and transferring a pattern formed on a reticle onto a wafer by use of the exposure apparatus.

33. A device manufacturing method, comprising the steps of:

providing an exposure apparatus as recited in claim 29; and transferring a pattern formed on a reticle onto a wafer by use of the exposure apparatus.

* * * * *

UNITED STATES PATENT AND TRADEMARK OFFICE
CERTIFICATE OF CORRECTION

PATENT NO. : 6,265,793 B1
DATED : July 24, 2001
INVENTOR(S) : Nobushige Korenaga It is certified that error appears in the above-identified patent and that said Letters Patent is hereby corrected as shown below:

Drawings,
FIG. 16, in "(Step S1)", "DESINGN" should read -- DESIGN --.

Column 3,
Line 52, "Insulating" should read -- insulating --.

Column 4,
Line 29, "aid" should read -- and --.

Column 5,
Line 12, "linea" should read -- linear --; and
Line 64, "in" should read -- is --.

Column 6,
Line 59, "coil r" should read -- coil r. --.

Column 7,
Line 16, "lengthly" should read -- length ly --.

Column 8,
Line 21, "to" should read -- t0. --.

Column 9,
Line 15, "a" should be deleted.

Column 12,
Line 47, "fa" should read -- fs --.

UNITED STATES PATENT AND TRADEMARK OFFICE
CERTIFICATE OF CORRECTION

PATENT NO. : 6,265,793 B1
DATED : July 24, 2001
INVENTOR(S) : Nobushige Korenaga It is certified that error appears in the above-identified patent and that said Letters Patent is hereby corrected as shown below:

Column 14,
Line 61, "water" should read -- wafer --.

Signed and Sealed this

Sixteenth Day of April, 2002

Attest:

JAMES E. ROGAN
Director of the United States Patent and Trademark Office

Attesting Officer

UNITED STATES PATENT AND TRADEMARK OFFICE
CERTIFICATE OF CORRECTION

PATENT NO. : 6,265,793 B1
DATED : July 24, 2001
INVENTOR(S) : Nobushige Korenaga It is certified that error appears in the above-identified patent and that said Letters Patent is hereby corrected as shown below:

Drawings,
FIG. 16, in "(Step S1)", "DESINGN" should read -- DESIGN --.

Column 3,
Line 52, "Insulating" should read -- insulating --.

Column 4,
Line 29, "aid" should read -- and --.

Column 5,
Line 12, "linea" should read -- linear --; and
Line 64, "in" should read -- is --.

Column 6,
Line 59, "coil r" should read -- coil r. --.

Column 7,
Line 16, "lengthly" should read -- length ly --.

Column 8,
Line 21, "to" should read -- t0. --.

Column 9,
Line 15, "a" should be deleted.

Column 12,
Line 47, "fa" should read -- fs --.

UNITED STATES PATENT AND TRADEMARK OFFICE
CERTIFICATE OF CORRECTION

PATENT NO. : 6,265,793 B1
DATED : July 24, 2001
INVENTOR(S) : Nobushige Korenaga It is certified that error appears in the above-identified patent and that said Letters Patent is hereby corrected as shown below:

<u>Column 14,</u>
Line 61, "water" should read -- wafer --.

This certificate supersedes Certificate of Correction issued April 16, 2002

Signed and Sealed this

Fourth Day of June, 2002

*Attest:*

*Attesting Officer*

JAMES E. ROGAN
*Director of the United States Patent and Trademark Office*